(12) United States Patent
Omura et al.

(10) Patent No.: US 10,762,246 B2
(45) Date of Patent: Sep. 1, 2020

(54) INFORMATION PROCESSING APPARATUS, INFORMATION PROCESSING METHOD, AND NON-TRANSITORY COMPUTER READABLE MEDIUM

(71) Applicant: FUJI XEROX CO., LTD., Tokyo (JP)

(72) Inventors: Kengo Omura, Yokohama (JP); Qianru Qiu, Yokohama (JP); Yuhei Shimada, Yokohama (JP)

(73) Assignee: FUJI XEROX CO., LTD., Tokyo (JP)

(*) Notice: Subject to any disclaimer, the term of this patent is extended or adjusted under 35 U.S.C. 154(b) by 294 days.

(21) Appl. No.: 15/244,357

(22) Filed: Aug. 23, 2016

(65) Prior Publication Data
US 2017/0262555 A1 Sep. 14, 2017

(30) Foreign Application Priority Data
Mar. 14, 2016 (JP) ................................ 2016-049600

(51) Int. Cl.
*G06F 30/00* (2020.01)

(52) U.S. Cl.
CPC .................................. *G06F 30/00* (2020.01)

(58) Field of Classification Search
CPC .................................................. G06F 17/5009
USPC ........................................................ 703/1, 6
See application file for complete search history.

(56) References Cited

U.S. PATENT DOCUMENTS 8,718,369 B1 * 5/2014 Tompkins ......... G06F 17/30259
382/181

FOREIGN PATENT DOCUMENTS

| JP | H09-305598 A | 11/1997 |
|---|---|---|
| JP | H10-11481 A | 1/1998 |
| JP | 2005-339251 A | 12/2005 |
| JP | 2006-4451 A | 1/2006 |
| JP | 2014-006703 A | 1/2014 |
| JP | 2016-21108 A | 2/2016 |

OTHER PUBLICATIONS

"Three-dimensional shape searching: state-of-the-art review and future trends" Computer-Aided Design vol. 37, Issue 5, Apr. 15, 2005, pp. 509-530.*
Feb. 25, 2020 Office Action issued in Japanese Patent Application No. 2016-049600.

* cited by examiner

*Primary Examiner* — Saif A Alhija
(74) *Attorney, Agent, or Firm* — Oliff PLC

(57) ABSTRACT

An information processing apparatus includes a matching design element determination unit and a creation unit. The matching design element determination unit determines a combination of matching design elements that meets a base impression evocation criterion, by combining plural design elements which define a design and correspond to a base style having the base impression and plural design elements which correspond to an auxiliary style having an auxiliary impression different from the base impression of the base style. The creation unit creates a design sample by using the combination of the matching design elements.

4 Claims, 33 Drawing Sheets

FIG. 5

| DESIGN ITEM | DESIGN ELEMENT (DESIGN ATTRIBUTE) | PERCEPTUAL SCORE (STYLE SCORE) |
|---|---|---|
| BACKGROUND DESIGN | 1: DESIGN 1<br>2: DESIGN 2<br>3: DESIGN 3<br>4: DESIGN 4<br>5: DESIGN 5<br>6: DESIGN 6<br>7: DESIGN 7<br>8: DESIGN 8<br>9: DESIGN 9<br>10: DESIGN 10<br>11: DESIGN 11<br>12: DESIGN 12<br>13: PLAIN | −0.12<br>0.01<br>0.2<br>0.28<br>0.08<br>0.04<br>0.46<br>−0.08<br>−0.15<br>−0.1<br>−0.33<br>−0.11<br>−0.04 |
| HUE OF BASE COLOR (COLOR OF DESIGN) | 1: R<br>2: YR<br>3: Y<br>4: GY<br>5: G, BG<br>6: B<br>7: PB<br>8: P, RP<br>9: NEUTRAL | 0.18<br>0.1<br>−0.11<br>−0.13<br>0.12<br>−0.13<br>−0.16<br>−0.17<br>0.12 |
| TONE OF BASE COLOR (COLOR OF DESIGN) | 1: V & S<br>2: B<br>3: P & VP<br>4: L & Lgr<br>5: Dl & Gr<br>6: Dp<br>7: Dk & Dgr<br>8: WHITE | 0.49<br>−0.05<br>−0.1<br>0.03<br>0<br>0.19<br>0.03<br>−0.34 |

FIG. 6

| DESIGN ITEM | DESIGN ELEMENT (DESIGN ATTRIBUTE) | PERCEPTUAL SCORE (STYLE SCORE) |
|---|---|---|
| TEXT INFORMATION LAYOUT | 1: PATTERN 1<br>2: PATTERN 2<br>3: PATTERN 3<br>4: PATTERN 4<br>5: PATTERN 5<br>6: PATTERN 6<br>7: PATTERN 7<br>8: PATTERN 8<br>9: PATTERN 9<br>10: PATTERN 10<br>11: PATTERN 11 | 0.01<br>0.21<br>−0.05<br>0.05<br>−0.17<br>−0.01<br>−0.21<br>0.24<br>−0.14<br>−0.05<br>−0.03 |
| NAME FONT SIZE | 1: SMALL (<17P)<br>2: INTERMEDIATE (17P–23P)<br>3: LARGE (24P–30P)<br>4: EXTRA-LARGE (≥31P) | −0.2<br>−0.17<br>0.05<br>0.6 |
| NAME FONT TYPE | 1: FONT 1<br>2: FONT 2<br>3: FONT 3<br>4: FONT 4<br>5: FONT 5<br>6: FONT 6<br>7: FONT 7 | −0.09<br>0.01<br>−0.01<br>0<br>−0.04<br>0.15<br>−0.13 |

FIG. 7

Business Card Creation System

Register Business Card Information | Display Design Samples

◆ Please enter information to be put on your business cards.

Name: Taro Fuji
Company Name: Fuji Design Inc.
Department: Research/Design Headquarters
Job Title: Chief Designer
Zip Code: 220-8668
Adress: 6-1, Minatomirai, Nishi-ku, Yokohama-shi, Kanagawa, Japan
Tel: +81-45-801-1314
Email: fuji.taro@fujidesign.co.jp
URL:

Register Logo

◆ Basic Style of Business Card

Type: Landscape
Color Mode: Color
Photo: No Photo
Background: Plain

Research/Design Headquarters
Taro Fuji
Chief Designer

Fuji Design Inc.
6-1, Minatomirai, Nishi-ku, Yokohama-shi, Kanagawa 220-8668, Japan
Tel +81-45-801-1314
Email fuji.taro@fujidesign.co.jp

FUJI DESIGN

FIG. 14

| FACTOR 1 | | FACTOR 2 | | FACTOR 3 | |
|---|---|---|---|---|---|
| DYNAMIC | 0.997 | FRESH | 0.897 | NATURAL | 0.566 |
| WILD | 0.988 | PRETTY | 0.884 | FORMAL | 0.375 |
| POP | 0.452 | CASUAL | 0.716 | CLASSIC | 0.297 |
| CASUAL | 0.377 | POP | 0.635 | CLEAR | 0.287 |
| DANDY | 0.300 | ROMANTIC | 0.619 | CHIC | 0.093 |
| GORGEOUS | 0.216 | NATURAL | 0.510 | FRESH | 0.080 |
| MODERN | 0.202 | CLEAR | 0.396 | DANDY | 0.060 |
| FRESH | 0.117 | MODERN | 0.202 | ELEGANT | 0.041 |
| PRETTY | −0.07 | ELEGANT | 0.139 | PRETTY | 0.029 |
| COOL | −0.065 | GORGEOUS | −0.018 | DYNAMIC | 0.023 |
| ROMANTIC | −0.149 | COOL | −0.025 | WILD | 0.015 |
| CLEAR | −0.181 | DYNAMIC | −0.111 | CASUAL | 0.014 |
| ELEGANT | −0.185 | WILD | −0.242 | ROMANTIC | −0.034 |
| CHIC | −0.279 | FORMAL | −0.282 | COOL | −0.080 |
| NATURAL | −0.312 | CHIC | −0.287 | POP | −0.084 |
| CLASSIC | −0.315 | CLASSIC | −0.298 | GORGEOUS | −0.099 |
| FORMAL | −0.363 | DANDY | −0.340 | MODERN | −0.354 |

FIG. 17

| WILD | 1.545 | A |
|---|---|---|
| DYNAMIC | 1.545 | A |
| DANDY | 1.279 | B |
| GORGEOUS | 0.955 | B |
| COOL | 0.916 | B |
| MODERN | 0.828 | B |
| ELEGANT | 0.754 | B |
| FORMAL | 1.251 | C |
| CLASSIC | 1.237 | C |
| CHIC | 1.191 | C |
| ROMANTIC | 0.284 | D |
| FRESH | 0.194 | D |
| POP | 0.589 | E |
| CASUAL | 0.478 | E |
| NATURAL | 0.698 | F |
| CLEAR | 0.563 | F |

| | MIXING RATIO (%) | |
|---|---|---|
| | PERCENTAGE OF BASE STYLE | PERCENTAGE OF AUXILIARY STYLE |
| (1) | 95 | 5 |
| (2) | 90 | 10 |
| (3) | 85 | 15 |
| (4) | 80 | 20 |
| (5) | 75 | 25 |
| (6) | 70 | 30 |
| (7) | 65 | 35 |
| (8) | 60 | 40 |
| (9) | 55 | 45 |
| (10) | 50 | 50 |

FIG. 20

| DESIGN ITEM | DESIGN ELEMENT (DESIGN ATTRIBUTE) | PERCEPTUAL SCORE (STYLE SCORE) | | MIXED PERCEPTUAL SCORE | DESIGN ELEMENT WITH LARGEST VALUE |
|---|---|---|---|---|---|
| | | PRETTY | DYNAMIC | 50P : 50D | |
| BACKGROUND DESIGN | 1: SPIRAL TREE | 0.77 | −0.10 | 0.33 | |
| | 2: DECORATED CORNER 1 | 0.14 | 0.05 | 0.09 | |
| | 3: DECORATED CORNER 2 | 0.02 | 0.21 | 0.11 | |
| | 4: HORIZONTALLY ARRANGED V | −0.28 | 0.33 | 0.03 | |
| | 5: GRID | −0.37 | 0.10 | −0.14 | |
| | 6: LEAF BUD | 0.37 | 0.18 | 0.27 | |
| | 7: THICK OBLIQUE LINE | −0.37 | 0.48 | 0.05 | |
| | 8: CHERRY BLOSSOMS | 0.76 | −0.05 | 0.35 | ○ |
| | 9: WAVES AND COLORED LEAVES | 0.35 | −0.15 | 0.10 | |
| | 10: RANGE | 0.39 | −0.10 | 0.14 | |
| | 11: RECTANGLE | 0 | −0.21 | −0.10 | |
| | 12: THIN LINE | −0.39 | −0.21 | −0.30 | |
| | 13: PLAIN | −0.40 | −0.11 | −0.25 | |
| DISTRIBUTION OF TEXT ELEMENTS | 1: FRONT ALIGNMENT | 0.10 | 0.01 | 0.05 | |
| | 2: BOTH CENTER ALIGNMENT | −0.18 | 0.40 | 0.11 | |
| | 3: NOT ALIGNED | 0.03 | −0.05 | −0.01 | |
| | 4: BACK ALIGNMENT | 0.05 | 0.11 | 0.08 | |
| | 5: CENTER ALIGNMENT | −0.09 | −0.23 | −0.16 | |
| | 6: FRONT-BACK ALIGNMENT | 0 | 0 | 0 | |
| | 7: AXIS ALIGNMENT | −0.02 | −0.28 | −0.15 | |
| | 8: RADIAL ALIGNMENT | 0.08 | 0.34 | 0.21 | ○ |
| | 9: PUT IN 1 BOX | −0.07 | −0.22 | −0.14 | |
| | 10: PUT IN 2 BOXES | −0.17 | −0.18 | −0.17 | |
| | 11: BOTH FRONT ALIGNMENT | −0.04 | −0.08 | −0.06 | |
| NAME FONT | 1: HELVETICA | −0.04 | −0.11 | −0.07 | |
| | 2: MYRIAD PRO | −0.04 | 0.02 | −0.01 | |
| | 3: GLASGOW | −0.05 | −0.01 | −0.03 | |
| | 4: KARAT | 0.10 | 0.05 | 0.08 | ○ |
| | 5: CENTURY GOTHIC | −0.16 | −0.10 | −0.13 | |
| | 6: ROCKWELL | 0 | 0.16 | 0.08 | |
| | 7: FELIX TILTING | 0.14 | −0.13 | 0.01 | |
| NAME DIRECTION | 1: HORIZONTAL | −0.03 | −0.04 | −0.04 | |
| | 2: VERTICAL | 0.05 | 0.06 | 0.05 | ○ |

FIG. 21

| DESIGN ITEM | DESIGN ELEMENT (DESIGN ATTRIBUTE) | PERCEPTUAL SCORE (STYLE SCORE) 74 | | MIXED PERCEPTUAL SCORE 78 | DESIGN ELEMENT WITH LARGEST VALUE |
|---|---|---|---|---|---|
| | | PRETTY | DYNAMIC | 50P: 50D | |
| NAME VERTICAL ALIGNMENT | 1: TOP | −0.02 | 0.01 | 0 | |
| | 2: TOP-CENTER | 0.02 | 0 | 0.01 | ○ |
| | 3: CENTER | 0.01 | 0 | 0 | |
| | 4: CENTER-BOTTOM | −0.07 | 0.02 | −0.02 | |
| | 5: BOTTOM | 0.05 | −0.07 | −0.01 | |
| NAME HORIZONTAL ALIGNMENT | 1: LEFT | 0.01 | 0.02 | 0.01 | ○ |
| | 2: LEFT-CENTER | 0.01 | 0.01 | 0.01 | |
| | 3: CENTER | 0 | −0.04 | −0.02 | |
| | 4: CENTER-RIGHT | −0.01 | −0.02 | −0.02 | |
| | 5: RIGHT | −0.05 | 0.07 | 0.01 | |
| NAME FORM | 1: STRAIGHT LINE | −0.01 | −0.03 | −0.02 | |
| | 2: OBLIQUE LINE | 0.06 | 0.15 | 0.15 | ○ |
| | 3: SCATTERED | −0.08 | −0.01 | −0.05 | |
| NAME SIZE (pt) | 1: SIZE<17 | −0.10 | −0.27 | −0.19 | |
| | 2: 17≤SIZE<24 | −0.02 | −0.21 | −0.12 | |
| | 3: 24≤SIZE<31 | 0.07 | 0.12 | 0.09 | |
| | 4: 31≤SIZE | 0.02 | 0.69 | 0.36 | ○ |
| COMPANY NAME TYPING DIRECTION | 1: HORIZONTAL | 0.02 | 0.01 | 0.01 | ○ |
| | 2: VERTICAL | −0.05 | −0.02 | −0.03 | |
| COMPANY NAME VERTICAL ALIGNMENT | 1: TOP | −0.03 | −0.01 | −0.02 | |
| | 2: TOP-CENTER | 0.03 | 0.04 | 0.04 | ○ |
| | 3: CENTER | −0.04 | −0.09 | −0.06 | |
| | 4: CENTER-BOTTOM | 0.03 | 0.03 | 0.03 | |
| | 5: BOTTOM | −0.01 | 0.03 | 0.01 | |
| COMPANY NAME HORIZONTAL ALIGNMENT | 1: LEFT | 0.01 | −0.01 | 0 | |
| | 2: LEFT-CENTER | 0.03 | −0.02 | 0.01 | |
| | 3: CENTER | 0.03 | 0.01 | 0.02 | ○ |
| | 4: CENTER-RIGHT | −0.08 | −0.02 | −0.05 | |
| | 5: RIGHT | −0.05 | 0.06 | 0 | |
| COMPANY NAME SIZE (pt) | 1: SIZE<9 | 0.10 | 0.19 | 0.15 | ○ |
| | 2: 9≤SIZE<11 | −0.03 | −0.05 | −0.04 | |
| | 3: 11≤SIZE | −0.28 | −0.46 | −0.37 | |

PRETTY: 75%, DYNAMIC 25%

FIG. 31

| RANKING | ATTRIBUTE SET ID | SCORE | DESIGN ELEMENT SET ||||||||
|---|---|---|---|---|---|---|---|---|---|
| | | | BACKGROUND DESIGN TYPE | NAME/COMPANY NAME ALIGNMENT | NAME FONT TYPE | NAME TYPING DIRECTION | NAME SIZE | (HORIZONTAL) NAME POSITION | (VERTICAL) NAME POSITION |
| 1 | Pretty 001 | 4.52 | DESIGN A | CENTER | FONT A | HORIZONTAL | 17-24 | CENTER | SLIGHTLY ABOVE |
| 2 | Pretty 002 | 4.51 | DESIGN A | CENTER | FONT B | HORIZONTAL | 17-24 | CENTER | SLIGHTLY ABOVE |
| 3 | Pretty 003 | 4.48 | DESIGN A | LEFT | FONT A | HORIZONTAL | 17-24 | CENTER | CENTER |
| 4 | Pretty 004 | 4.43 | DESIGN A | LEFT | FONT B | HORIZONTAL | <17 | CENTER | SLIGHTLY ABOVE |
| 5 | Pretty 005 | 4.12 | DESIGN A | CENTER | FONT A | HORIZONTAL | <17 | SLIGHTLY LEFT | SLIGHTLY BELOW |
| 6 | Pretty 006 | 4.08 | DESIGN B | CENTER | FONT A | VERTICAL | 17-24 | SLIGHTLY LEFT | SLIGHTLY BELOW |
| 7 | Pretty 007 | 4.02 | DESIGN B | RIGHT | FONT C | VERTICAL | 17-24 | SLIGHTLY RIGHT | SLIGHTLY BELOW |
| 8 | Pretty 008 | 4.00 | DESIGN B | RIGHT | FONT C | VERTICAL | 17-24 | CENTER | CENTER |
| 9 | Pretty 009 | 3.97 | DESIGN A | CENTER | FONT A | HORIZONTAL | 17-24 | SLIGHTLY LEFT | CENTER |
| 10 | Pretty 010 | 3.88 | DESIGN A | CENTER | FONT A | HORIZONTAL | 17-24 | SLIGHTLY LEFT | SLIGHTLY BELOW |
| 11 | Pretty 011 | 3.84 | DESIGN B | LEFT | FONT A | HORIZONTAL | 17-24 | CENTER | SLIGHTLY ABOVE |
| 12 | Pretty 012 | 3.84 | DESIGN C | CENTER | FONT B | HORIZONTAL | 24-31 | CENTER | CENTER |
| 13 | Pretty 013 | 3.71 | DESIGN A | CENTER | FONT B | VERTICAL | 24-31 | CENTER | BOTTOM |
| 14 | Pretty 014 | 3.65 | DESIGN A | NOT ALIGNED | FONT C | VERTICAL | 17-24 | SLIGHTLY RIGHT | SLIGHTLY BELOW |
| 15 | Pretty 015 | 3.62 | DESIGN D | NOT ALIGNED | FONT A | VERTICAL | 17-24 | SLIGHTLY RIGHT | CENTER |
| 16 | Pretty 016 | 3.55 | DESIGN B | CENTER | FONT B | HORIZONTAL | <17 | CENTER | CENTER |
| 17 | Pretty 017 | 3.57 | DESIGN B | CENTER | FONT C | HORIZONTAL | <17 | CENTER | BOTTOM |

FIG. 33

Table 92:

| RANKING | ID | SCORE | ITEM 1 | ITEM 2 | ITEM 3 | ITEM 4 | ITEM 5 |
|---|---|---|---|---|---|---|---|
| 1 | | 4.4 | 1 | 2 | 1 | 3 | 5 |
| 2 | | 4.3 | 1 | 3 | 6 | 2 | 3 |
| 3 | | 4.2 | 2 | 3 | 6 | 2 | 3 |
| 4 | | 4.0 | 1 | 2 | 6 | 3 | 5 |
| 5 | | 3.9 | 1 | 3 | 4 | 2 | 3 |
| 6 | | 3.9 | 2 | 3 | 6 | 2 | 4 |
| 7 | | 3.8 | 2 | 2 | 1 | 3 | 5 |
| 8 | | 3.7 | 1 | 3 | 1 | 3 | 5 |
| 9 | | 3.7 | 1 | 3 | 6 | 2 | 2 |
| 10 | | 3.6 | 1 | 3 | 6 | 2 | 2 |
| 11 | | 3.6 | 1 | 2 | 7 | 4 | 1 |
| 12 | | 3.5 | | | | | |
| 13 | | 3.4 | | | | | |
| 14 | | 3.4 | | | | | |
| 15 | | 3.3 | | | | | |
| 16 | | 3.3 | | | | | |

Table 90:

| RANKING | ID | SCORE | ITEM 1 | ITEM 2 | ITEM 3 | ITEM 4 | ITEM 5 |
|---|---|---|---|---|---|---|---|
| 14 | | 3.9 | 3 | 2 | 6 | 4 | 1 |
| 15 | | 3.9 | 3 | 2 | 1 | 4 | 1 |
| 16 | | 3.8 | 3 | 3 | 1 | 3 | 1 |
| 17 | | 3.8 | 2 | 1 | 1 | 3 | 1 |
| 18 | | 3.8 | 2 | 1 | 1 | 4 | 5 |
| 19 | | 3.7 | 2 | 2 | 4 | 2 | 5 |
| 20 | | 3.7 | 3 | 1 | 3 | 4 | 4 |
| 21 | | 3.6 | 3 | 2 | 3 | 2 | 3 |
| 22 | | 3.6 | 3 | 2 | 7 | 4 | 1 |
| 23 | | 3.6 | 1 | 2 | 7 | 4 | 1 |
| 24 | | 3.4 | | | | | |
| 25 | | 3.4 | | | | | |
| 26 | | 3.3 | | | | | |
| 27 | | 3.2 | | | | | |

BASE STYLE THRESHOLD θ (3.5)

INFORMATION PROCESSING APPARATUS, INFORMATION PROCESSING METHOD, AND NON-TRANSITORY COMPUTER READABLE MEDIUM

CROSS-REFERENCE TO RELATED APPLICATIONS

This application is based on and claims priority under 35 USC 119 from Japanese Patent Application No. 2016-049600 filed Mar. 14, 2016.

BACKGROUND (i) Technical Field

The present invention relates to an information processing apparatus, an information processing method, and a non-transitory computer readable medium.

(ii) Related Art

There are cases where a person creates a design of a target object by selecting a design sample having an intended impression from among plural design samples.

When a person searches plural design samples for design samples having an intended impression by specifying only a specific impression, plural design samples that resemble one another (rarely differ from one another) are retrieved in some cases. In such cases, the person has no other choice but to select an intended design sample from among the plural resembling design samples.

SUMMARY

According to an aspect of the invention, there is provided an information processing apparatus including a matching design element determination unit and a creation unit. The matching design element determination unit determines a combination of matching design elements that meets a base impression evocation criterion, by combining plural design elements which define a design and correspond to a base style having the base impression and plural design elements which correspond to an auxiliary style having an auxiliary impression different from the base impression of the base style. The creation unit creates a design sample by using the combination of the matching design elements.

BRIEF DESCRIPTION OF THE DRAWINGS

Exemplary embodiments of the present invention will be described in detail based on the following figures, wherein:

FIG. 5 illustrates an example of perceptual score data;

FIG. 6 illustrates an example of the perceptual score data;

FIG. 7 illustrates an example of a business card information registration screen;

FIG. 14 illustrates an example of factor loadings obtained by a style factor analysis;

FIG. 17 illustrates an example of a style-style distance table for each cluster;

FIG. 20 illustrates an example of perceptual score data;

FIG. 21 illustrates an example of the perceptual score data;

FIG. 31 illustrates an example of a score table;

FIG. 33 illustrates examples of score tables;

FIG. 34 illustrates an example of a design sample display screen; and

DETAILED DESCRIPTION

First Exemplary Embodiment

Figure 1:
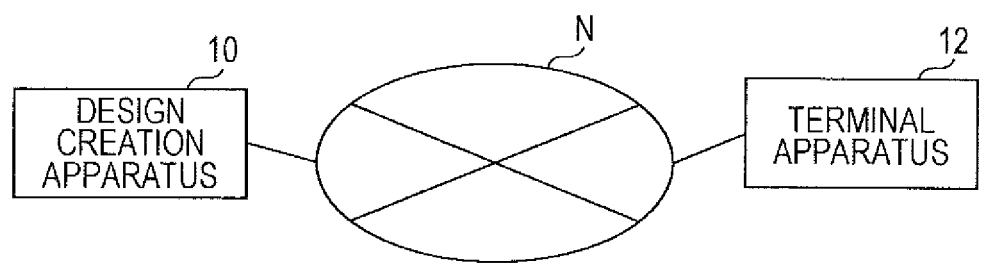
FIG. 1 is a block diagram illustrating a design creation system according to a first exemplary embodiment of the present invention.

A design creation system, which is an information processing system according to a first exemplary embodiment of the present invention, will be described. FIG. 1 illustrates an example of the design creation system according to the first exemplary embodiment. The design creation system includes a design creation apparatus 10, which is an information processing apparatus, and a terminal apparatus 12. The design creation apparatus 10 and the terminal apparatus 12 are connected to a communication channel N, such as a network. Although one terminal apparatus 12 is connected to the communication channel N in the example illustrated in FIG. 1, plural terminal apparatuses 12 may be connected to the communication channel N.

The design creation apparatus 10 is an apparatus that creates or searches for a design sample of a target object having a specific style (impression) and provides data representing the design sample of the target object (e.g., image data or template data of the target object) as an output. Examples of the target object include business cards, leaflets, advertisements, direct mails, posters, post cards, catalogs, other kinds of documents, clothes, automobiles, buildings, and bridges. The design creation apparatus 10 also has functions of transmitting and receiving data to and from another apparatus.

The terminal apparatus 12 is an apparatus, such as a personal computer (PC), a tablet PC, a smartphone, or a mobile phone. The terminal apparatus 12 has functions of transmitting and receiving data to and from another apparatus. The terminal apparatus 12 is used when a user creates a design, for example.

In the first exemplary embodiment, a base style serving as a base of a design (theme of the design or style having a base impression) is selected using the terminal apparatus 12, and design samples that mainly evoke an impression of the base style and additionally evoke another impression are created or retrieved by the design creation apparatus 10.

Note that the terminal apparatus 12 may be incorporated into the design creation apparatus 10. That is, the design creation apparatus 10 and the terminal apparatus 12 may be a physically integrated apparatus.

Figure 2:
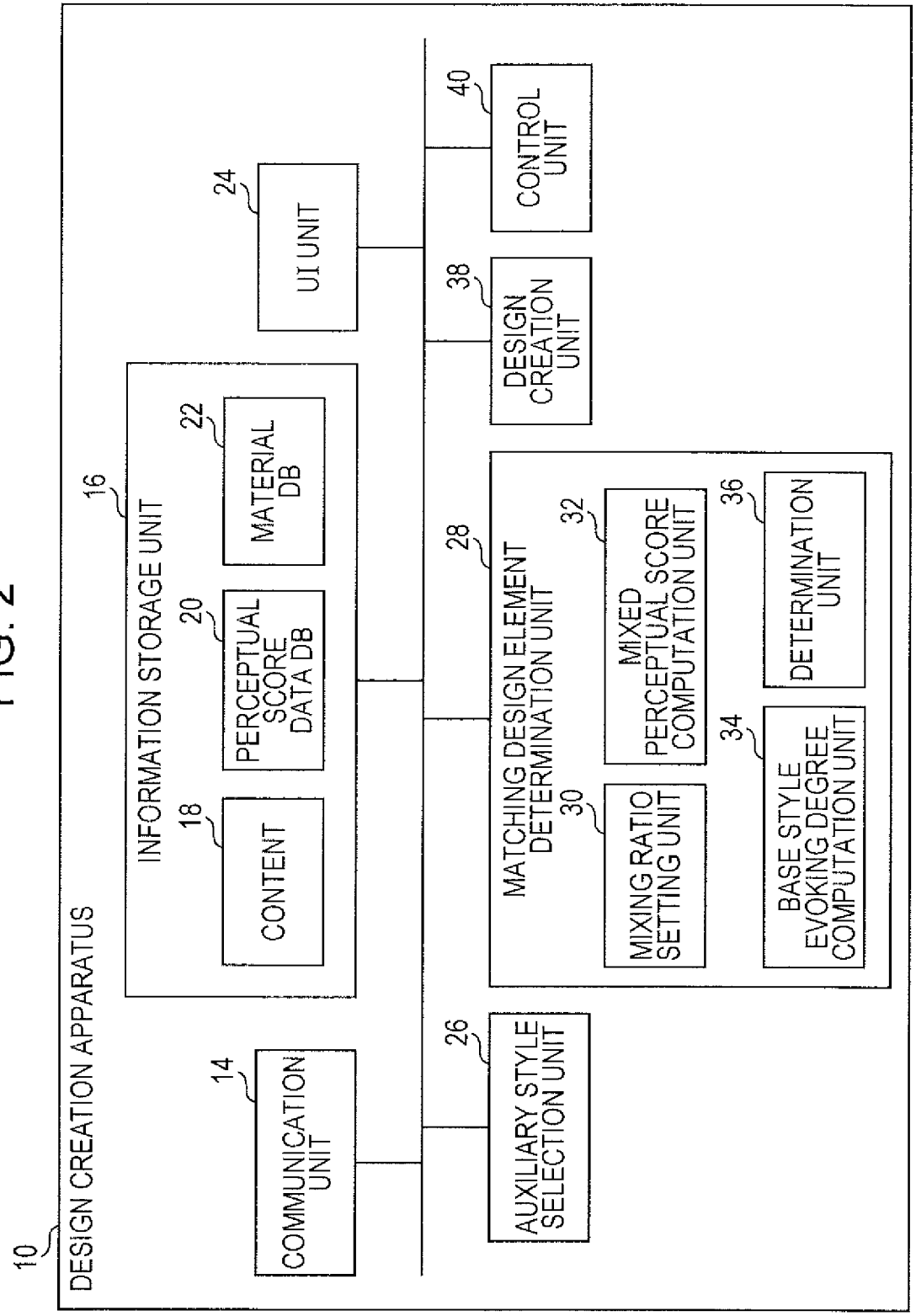
FIG. 2 is a block diagram illustrating a design creation apparatus according to the first exemplary embodiment.

A configuration of the design creation apparatus 10 according to the first exemplary embodiment will be described in detail below with reference to FIG. 2. FIG. 2 illustrates the configuration of the design creation apparatus 10.

The design creation apparatus 10 includes a communication unit 14, which is a communication interface. The communication unit 14 has functions of transmitting and receiving data to and from another apparatus via the communication channel N. For example, data representing a design sample of a target object is transmitted to the terminal apparatus 12 via the communication unit 14, and information transmitted from the terminal apparatus 12 is received via the communication unit 14.

The design creation apparatus 10 includes an information storage unit 16, which is a storage device such as a hard disk drive. The information storage unit 16 stores content 18 and includes a perceptual score data database (DB) 20 and a material DB 22.

The content 18 is data representing target objects for which a design is created. For example, the content 18 is data representing target objects, such as business cards, leaflets, advertisements, direct mails, posters, post cards, catalogs, other kinds of documents, clothes, automobiles, buildings, and bridges.

The perceptual score data DB 20 is a storage device such as a hard disk drive. The perceptual score data DB 20 stores perceptual score data (style score data). The perceptual score data is data created in advance for each target object for which a design is created and for each style. The perceptual score data is data indicating an association of perceptual information representing the style (impression) of the design and a perceptual score (style score, evaluation value) representing an evoking degree (impression degree, matching degree) of each design element (representation element, design attribute) of each style. The style is determined in advance on the basis of a preference model in which impressions which people feel for a target object are classified, for example. The perceptual score is a value indicating a degree of contribution of the design element to evoke the impression of the style (value indicating the impression strength). Each design sample includes, for example, multiple design items (design components). A design element is an element that defines a design of each design item (each design component). Multiple design elements are defined for each design item. The perceptual score of each design element for the style is determined in advance. The perceptual score is, for example, a value determined through a perceptual evaluation experiment according to a quantification method (1). For example, the better the style (impression) of the design element matches the style of the design, the higher the perceptual score (evoking degree) of the design element.

In addition, the style represented by the perceptual information is quantified, and the value is stored on the perceptual score data DB 20. The perceptual score data DB 20 stores, for example, impression map data (style map data). An impression map is a one-dimensional or multi-dimensional map representing a distribution of styles (impressions). The style represented by the perceptual information is defined as coordinates on the impression map.

The material DB 22 is a storage device such as a hard disk drive, and stores data of design items (design components) that constitute a design sample of a target object for which a design is created (hereinafter, also referred to as a design creation target object).

The design creation apparatus 10 includes a UI unit 24, which is a user interface and includes a display unit and an operation unit. The display unit is a display device, for example, a liquid crystal display. The operation unit is an input device, for example, a keyboard, a mouse, or a touch panel. Note that the design creation apparatus 10 need not necessarily include the UI unit 24.

The design creation apparatus 10 includes an auxiliary style selection unit 26. The auxiliary style selection unit 26 selects an auxiliary style having an impression different from the base style. The auxiliary style selection unit 26 selects auxiliary styles in accordance with any one of first to third selection methods, for example. The first selection method is a fixed method, in which the auxiliary style selection unit 26 selects N (N is an integer of 1 or greater) auxiliary styles in accordance with a predetermined priority order. The second selection method is a large distance method, in which the auxiliary style selection unit 26 selects, as auxiliary styles, styles having an impression whose difference from an impression of the base style is greater than or equal to a threshold. For example, the auxiliary style selection unit 26 selects, as auxiliary styles, styles having a distance from the base style greater than or equal to a threshold on the impression map. The threshold may be a value set in advance or may be changed by the user or the like. Alternatively, the auxiliary style selection unit 26 may select, as an auxiliary style, a style having the largest distance from the base style on the impression map. The third selection method is a cluster-based large distance method, in which the auxiliary style selection unit 26 selects, as auxiliary styles, styles having a distance from the base style greater than or equal to a threshold (e.g., having the largest distance) on the impression map from among clustered styles. In another example, the auxiliary style selection unit 26 may select, as auxiliary styles, styles having the largest factor loading in the positive and negative directions, by using a factor loading of a factor that defines the impression of the design. A process performed by the auxiliary style selection unit 26 will be described in detail later.

The design creation apparatus 10 includes a matching design element determination unit 28. The matching design element determination unit 28 combines multiple design elements that define a design corresponding to the base style and multiple design elements corresponding to the auxiliary style and determines a combination of matching design elements that meets a base style evoking criterion (also referred to as a base impression evocation criterion). A design sample that mainly evokes the impression of the base style and additionally evokes another impression is created by using this combination of the matching design elements.

The matching design element determination unit 28 includes, for example, a mixing ratio setting unit 30, a mixed perceptual score computation unit 32, a base style evoking degree computation unit 34, and a determination unit 36.

The mixing ratio setting unit 30 sets a mixing ratio at which the perceptual scores of design elements are mixed.

The mixed perceptual score computation unit 32 mixes a perceptual score indicating a degree of each design element contributing to evocation of the impression of the base style (hereinafter, referred to as a "base perceptual score") and a perceptual score indicating a degree of the design element contributing to evocation of the impression of the auxiliary style (hereinafter, referred to as an "auxiliary perceptual score") in accordance with the mixing ratio to compute a mixed perceptual score of the design element. The mixed perceptual score computation unit 32 determines, for each design item, a design element having the largest mixed perceptual score as a largest-value design element. The mixing ratio setting unit 30 sets a different mixing ratio for each process, and the mixed perceptual score computation unit 32 performs a mixing process while changing the mixing ratio. In this way, the mixed perceptual score computation unit 32 computes a mixed perceptual score for each mixing ratio and for each design element, and determines the largest-value design element for each design item.

The base style evoking degree computation unit 34 computes a base style evoking degree (hereinafter, also referred to as a base impression evocation degree) of the combination of the largest-value design elements of all the design items, on the basis of the sum of the base perceptual scores of the largest-value design elements of all the design items. The base style evoking degree computation unit 34 may use the sum or a value obtained by adding a constant to the sum as the base style evoking degree. The base style evoking degree corresponds to a value indicating a degree of the combination of the largest-value design elements of all the design items contributing to evocation of the impression of the base style (value indicating the strength of the impression). The higher the base style evoking degree of the combination of the largest-value design elements, the more the combination contributes to evocation of the impression of the base style.

The determination unit 36 determines, as the combination of the matching design elements, a combination of the largest-value design elements for which the base style evoking degree is greater than or equal to an evocation degree threshold (impression strength threshold). The evocation degree threshold may be a value set in advance or may be changed by the user.

The design creation apparatus 10 includes a design creation unit 38. The design creation unit 38 creates a design sample of a design creation target object (e.g., an image or template of the target object), by using design elements of design items. For example, the design creation unit 38 creates a design sample of the design creation target object by using the combination of the matching design elements. In this way, a design sample that mainly evokes the impression of the base style and additionally evokes another impression is created. A design sample created using a combination of matching design elements is also referred to as a "non-similar sample" below. The design creation unit 38 may also create a design sample by using design elements corresponding to the base style. Data representing the design samples created by the design creation unit 38 is transmitted to the terminal apparatus 12 via the communication unit 14, for example.

The design creation apparatus 10 includes a control unit 40. The control unit 40 controls operations of the individual units of the design creation apparatus 10.

Figure 3:
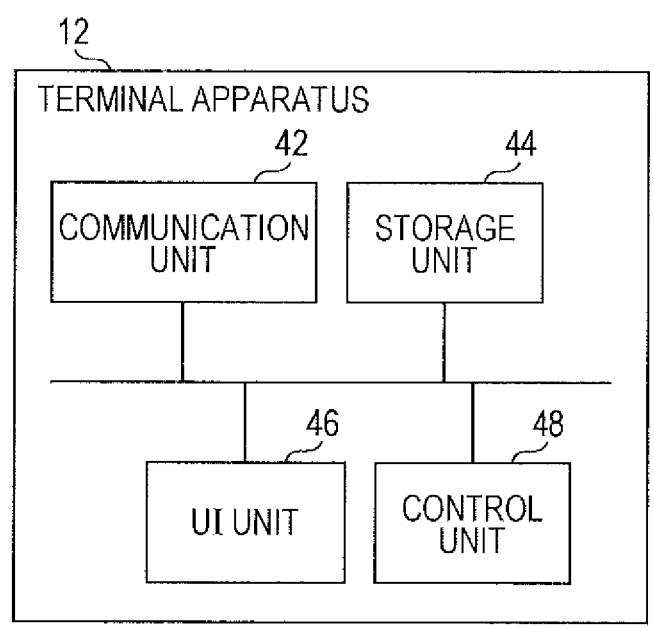
FIG. 3 is a block diagram illustrating a terminal apparatus.

A configuration of the terminal apparatus 12 will be described in detail below with reference to FIG. 3. FIG. 3 illustrates the configuration of the terminal apparatus 12.

The terminal apparatus 12 includes a communication unit 42, a storage unit 44, a UI unit 46, and a control unit 48. The communication unit 42 is a communication interface and has functions of transmitting and receiving data to and from another apparatus via the communication channel N. For example, information such as setting information is transmitted to the design creation apparatus 10 via the communication unit 42, and data representing design samples transmitted from the design creation apparatus 10 is received via the communication unit 42. The storage unit 44 is a storage device, such as a hard disk drive, and stores a program, data, and the like. The UI unit 46 is a user interface and includes a display unit and an operation unit. The operation unit is an input device, for example, a keyboard, a mouse, or a touch panel. The control unit 48 controls operations of the individual units of the terminal apparatus 12.

Figure 4:
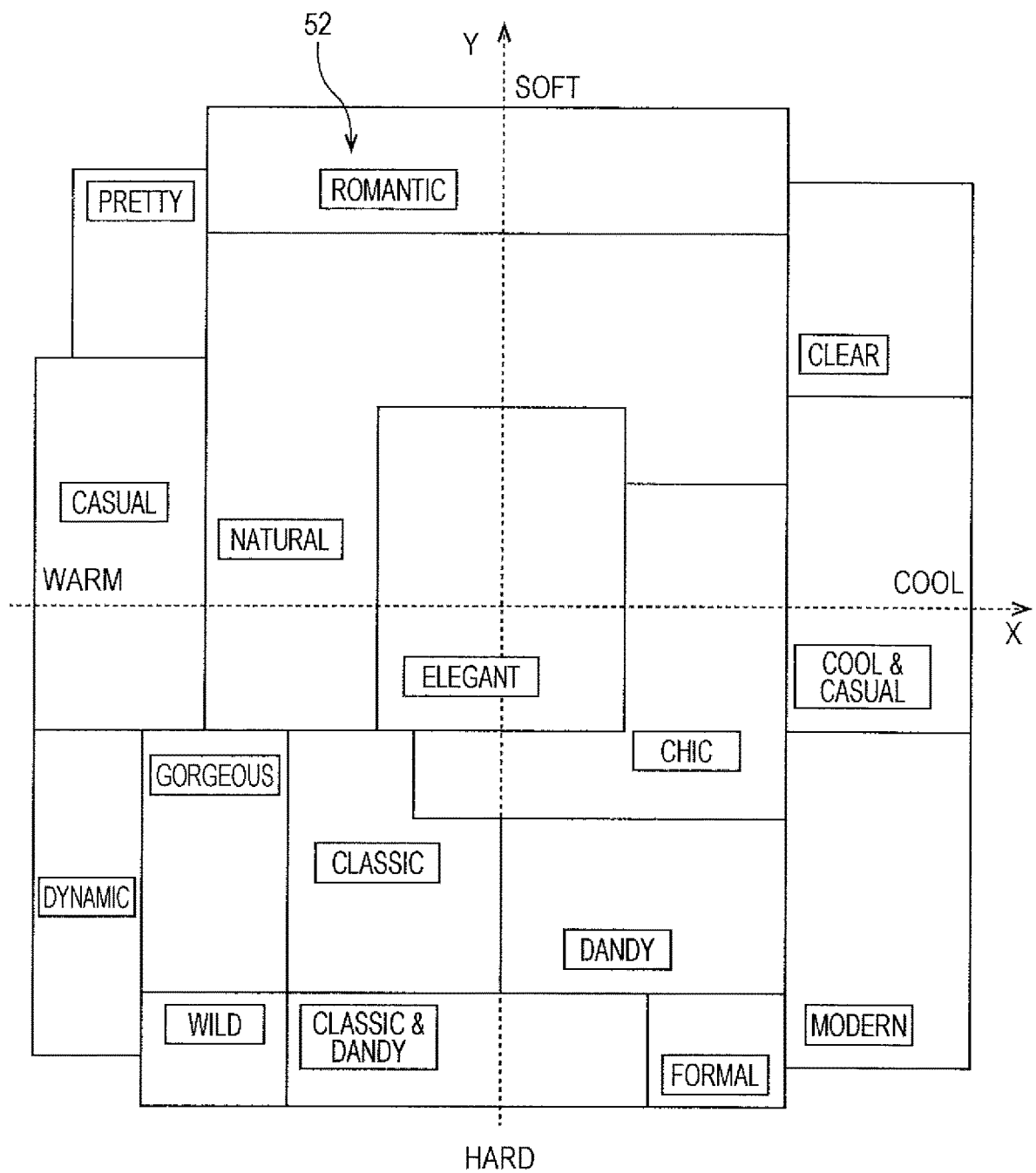
FIG. 4 illustrates an example of an impression map (style map)

The impression map (style map) will be described in detail below with reference to FIG. 4. FIG. 4 illustrates an example of the impression map. An impression map 50 is a two-dimensional map defined by two axes (X axis and Y axis), for example. Perceptual information representing each style is associated in advance with corresponding coordinates on the impression map 50. When coordinates on the impression map 50 are specified, the style (impression) corresponding to the coordinates is specified. On the impression map 50, the horizontal axis (X axis) is an index axis that defines a style index from "WARM" to "COOL", whereas the vertical axis (Y axis) is an index axis that defines a style index from "HARD" to "SOFT". The impression "COOL" is stronger in the right region. That is, a style for which the impression "COOL" is strong is associated in a region on the right. The impression "WARM" is stronger in the left region. That is, a style for which the impression "WARM" is strong is associated in a region on the left. In addition, the impression "SOFT" is stronger in the upper region. That is, a style for which the impression "SOFT" is strong is associated with the upper region. In contrast, the impression "HARD" is stronger in the lower region. That is, a style for which the impression "HARD" is strong is associated with the lower region.

In the example illustrated in FIG. 4, the impression map 50 is divided into multiple regions, and perceptual information (such as a style "ROMANTIC" 52, for example) is associated with one of the multiple regions. The impression map 50 is created in advance, and data of the impression map 50 is stored in advance on the perceptual score data DB 20. The different impression maps 50 may be defined for different design creation target objects, or the impression map 50 may be defined for multiple target objects in common. Note that the impression map 50 may be a map of three or higher dimensions or may be one-dimensional map.

The perceptual score data will be described below with reference to FIGS. 5 and 6. FIGS. 5 and 6 each illustrate an example of the perceptual score data. The perceptual score data is data created in advance for each design creation target object and for each style and is stored on the perceptual score data DB 20. In the perceptual score data, a design item, a design element (design attribute), and a perceptual score (style score) are associated with one another. A design item is a design component that constitutes a design sample. Each design item is associated with one or multiple design elements. A design element is an element that defines a design of the design item associated with the design element. A perceptual score is a value representing a degree of the design element evoking the impression of the style (impression strength, matching degree). That is, the perceptual score is a value representing the degree of the design element contributing to evocation of the impression of the style (value representing the strength of the impression) and is, for example, a value determined by an analysis based on the quantification method (I).

In the example illustrated in FIGS. 5 and 6, the design creation target object is "business card" and the style of the design is "wild". That is, the perceptual score data illustrated in FIGS. 5 and 6 is data representing the evoking degree (impression strength) of each design element for the style "wild" when the target object is "business card". For example, items such as "BACKGROUND DESIGN", "HUE OF BASE COLOR (COLOR OF DESIGN)", "TONE OF BASE COLOR (COLOR OF DESIGN)", and "TEXT INFORMATION LAYOUT" are design items of the target object "business card". One or multiple design elements are associated with each design item. The evoking degree (impression strength) representing a degree of each design element evoking the style "wild", that is, a degree of the design element contributing to evocation of the style "wild", is determined as the perceptual score. A design element having a higher perceptual score is a design element that contributes more to evocation of the style "wild" and corresponds to a design element suitable for the style "wild".

For example, as for the design item "BACKGROUND DESIGN", the design element "6: DESIGN 6" has a perceptual score of "0.04", whereas the design element "7: DESIGN 7" has a perceptual score of "0.46". Accordingly, the design element "7: DESIGN 7" has a higher degree of contribution to evocation of the style "wild" than the design element "6: DESIGN 6" as for the design item "BACKGROUND DESIGN" of the target object "business card". That is, it is evaluated that the design element "7: DESIGN 7" gives the impression of "wild" more strongly than the design element "7: DESIGN 7".

As for the design item "BACKGROUND DESIGN", the design element "7: DESIGN 7" has the highest perceptual score. That is, it is evaluated that the design element "7: DESIGN 7" contributes to evocation of the style "wild" at a higher degree than any other design elements of the design item "BACKGROUND DESIGN" of the target object "business card". In other words, it is evaluated that the design element "7: DESIGN 7" gives the impression "wild" the most strongly among the multiple design elements that belong to the design item "BACKGROUND DESIGN".

As for the design item "BACKGROUND DESIGN", the perceptual score of the design element "7: DESIGN 7" is the largest. As for the design item "HUE OF BASE COLOR (COLOR OF DESIGN)", the perceptual score of the design element "1:R" is the largest. As for the design item "TONE OF BASE COLOR (COLOR OF DESIGN)", the perceptual score of the design element "1: V & S" is the largest. As for the design item "TEXT INFORMATION LAYOUT", the perceptual score of the design element "8: PATTERN 8" is the largest. As for the design item "NAME FONT SIZE", the perceptual score of the design element "EXTRA-LARGE (≥31P)" is the largest. As for the design item "NAME FONT TYPE", the perceptual score of the design element "6: FONT 6" is the largest. Accordingly, when these design elements are used for all the design items, the impression strength (evoking degree) of the style "wild" is the strongest. That is, when a design sample of the target object "business card" is created using these design elements for all the design items, a design sample having the style (impression) "wild" strongly is created, compared with the case where other design elements are used. The design sample thus created is classified into a design sample having the "wild" style (impression) and is associated with coordinates corresponding to the style "wild" on the impression map 50 illustrated in FIG. 4.

For example, if the style "wild" is specified by the user when a design sample is created, the design creation unit 38 refers to the perceptual score data regarding the style "wild" and selects, for each of the design items, a design element having the largest perceptual score. As described above, the design elements such as "7: DESIGN 7" and "1:R" are selected. The design creation unit 38 creates a design sample by using the design elements thus selected. In this way, a design sample having the style (impression) "wild" is created, and data of the design sample is provided to the user.

A design sample may be created in advance for each style, and data of the design samples may be stored in advance on the information storage unit 16. For example, a design sample having the style "wild" is created in advance, and data of the design sample is stored in advance on the information storage unit 16. Design samples having other styles are also created in advance, and data of the design samples is stored in advance on the information storage unit 16. In this case, if the user specifies a style, the design creation unit 38 searches the information storage unit 16 for data of a design sample having the specified style and obtains the data of the design sample from the information storage unit 16. The data of the design sample is then transmitted from the design creation apparatus 10 to the terminal apparatus 12 via the communication channel N.

In addition, a non-similar sample may be created in advance using a combination of matching design elements, and data of the non-similar sample may be stored in advance on the information storage unit 16. In this case, if the user specifies the base style and inputs a non-similar-sample display instruction, the design creation unit 38 searches the information storage unit 16 for data of a non-similar sample that mainly evokes the impression of the specified base style and additionally evokes another impression and obtains data of the non-similar sample from the information storage unit 16. The data of the non-similar sample is transmitted from the design creation apparatus 10 to the terminal apparatus 12 via the communication channel N.

Note that design samples having impressions similar to one another (hereinafter, referred to as "similar samples") may be created in advance, and data of the similar samples may be stored in advance on the information storage unit 16. In this case, if the user specifies a design sample and inputs a similar-sample display instruction, the design creation unit 38 searches the information storage unit 16 for data of similar samples similar to the specified design sample and obtains data of the similar samples from the information storage unit 16. The data of the similar samples is transmitted from the design creation apparatus 10 to the terminal apparatus 12 via the communication channel N.

Design items and design elements respectively similar to the design items and the design elements illustrated in FIGS. 5 and 6 are defined also for styles other than the style "wild" for the target object "business card", and perceptual scores of the individual design elements are determined. The perceptual score data is created in advance for each style for the target object "business card" and is stored in advance on the perceptual score data DB 20.

While the case where the target object is "business card" has been described in the example illustrated in FIGS. 5 and 6, the perceptual score data is similarly created in advance for each style of other target objects and is stored in advance on the perceptual score data DB 20. For example, the perceptual score data is created in advance and is stored in advance on the perceptual score data DB 20 for the target objects, for example, advertisements, leaflets, posters, post cards, other types of documents, clothes, automobiles, buildings, or bridges. The design items and the design elements are defined for each target object, and the perceptual score is determined for each design element. For example, different design items and different design elements are used for "business card" and "advertisement".

A screen displayed when a design sample is created will be described in detail below. It is assumed that a design sample is created for the target object "business card", for example. When the design is created, business card information (personal information of a user) or the like to be put on the business card is input by the user by using the terminal apparatus 12. The input information is transmitted from the terminal apparatus 12 to the design creation apparatus 10 via the communication channel N. Needless to say, the information may be input directly to the design creation apparatus 10.

A screen for inputting the business card information will be described first with reference to FIG. 7. FIG. 7 illustrates an example of the screen. A business card information registration screen 54 is a screen for inputting the business card information and is displayed on the UI unit 46 of the terminal apparatus 12, for example. The business card information registration screen 54 includes an input field 56, and the business card information (information such as the name, the company name, and the contact designation) is input at the input field 56. In response to input of the business card information at the input field 56, an image 58 of a business card including the business card information is displayed in the business card information registration screen 54. The image 58 is an image of a business card having a design set by default. The input business card information is transmitted from the terminal apparatus 12 to the design creation apparatus 10 via the communication channel N. The design creation unit 38 of the design creation apparatus 10 creates a design sample by using the business card information.

Figure 8:
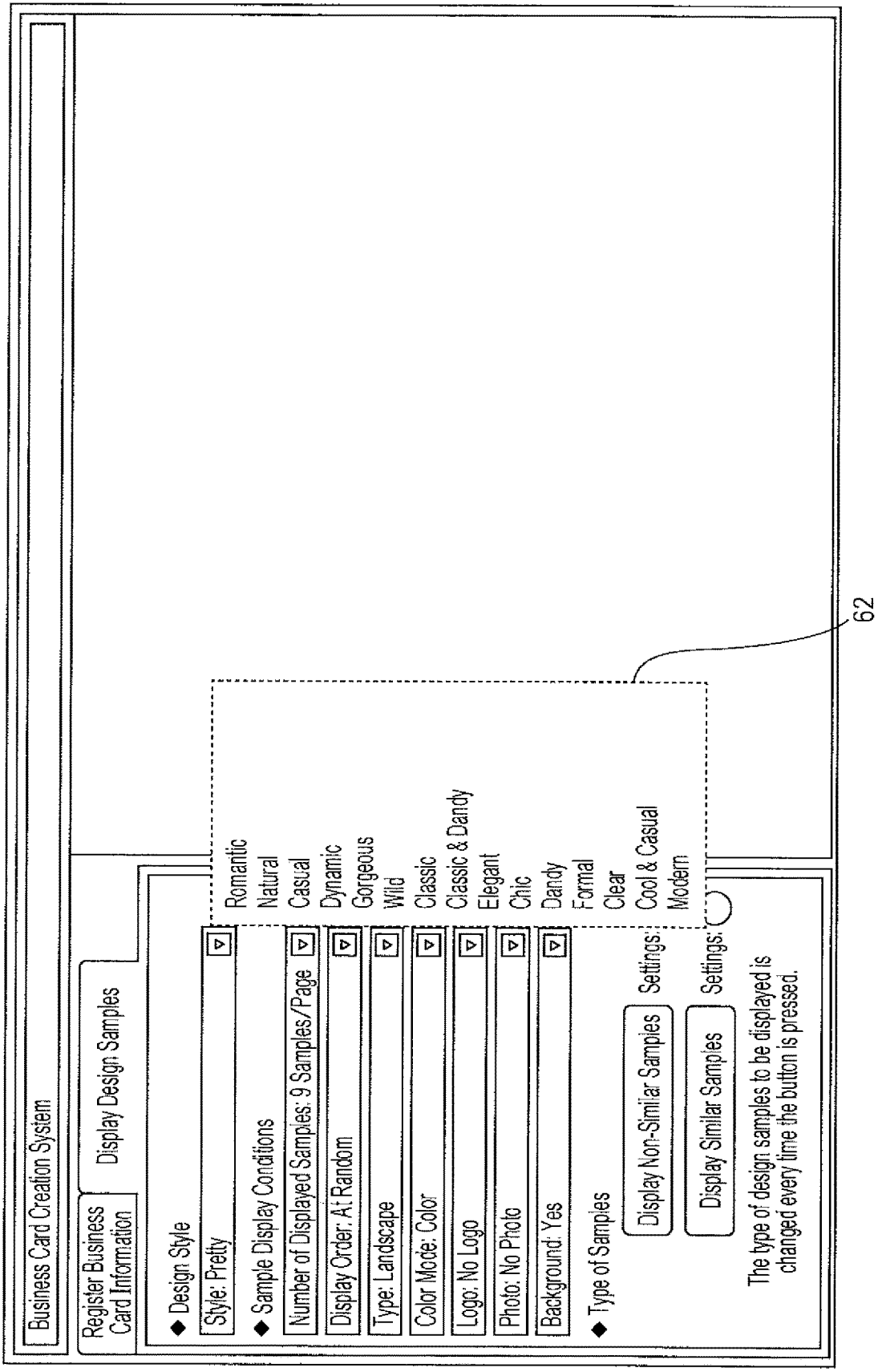
FIG. 8 illustrates an example of a design sample display screen.

A screen for displaying design samples will be described next with reference to FIG. 8. FIG. 8 illustrates an example of the screen. A design sample display screen 60 is a screen for displaying design samples and is displayed on the UI unit 46 of the terminal apparatus 12, for example. The design sample display screen 60 includes a field for specifying the base style (Design Style). In response to the user selecting the field, a selection field 62 for selecting a style is displayed, for example, as a pop-up screen. In the example illustrated in FIG. 8, character strings representing styles such as "Romantic" and "Natural" are displayed in the selection field 62. The user selects a specific style from among the styles displayed in the selection field 62. The selected style is used as the base style. Identification information (e.g., style ID) for identifying the base style is transmitted from the terminal apparatus 12 to the design creation apparatus 10 via the communication channel N. In the design creation apparatus 10, the auxiliary style selection unit 26 selects an auxiliary style on the basis of the base style, and the matching design element determination unit 28 determines a combination of matching design elements that meets the base style evoking criterion, and the design creation unit 38 creates a design sample by using the combination of the matching design elements. Alternatively, the design creation unit 38 searches for a design sample having the combination of the matching design elements. These processes will be described in detail later.

In the example illustrated in FIG. 8, the design sample display screen 60 includes a field for specifying sample display conditions. For example, the number of displayed samples, the display order, the type, the color mode, the logo setting, the photo setting, and the background setting are specified as the sample display conditions. The design samples are displayed in accordance with the specified sample display conditions.

Figure 9:
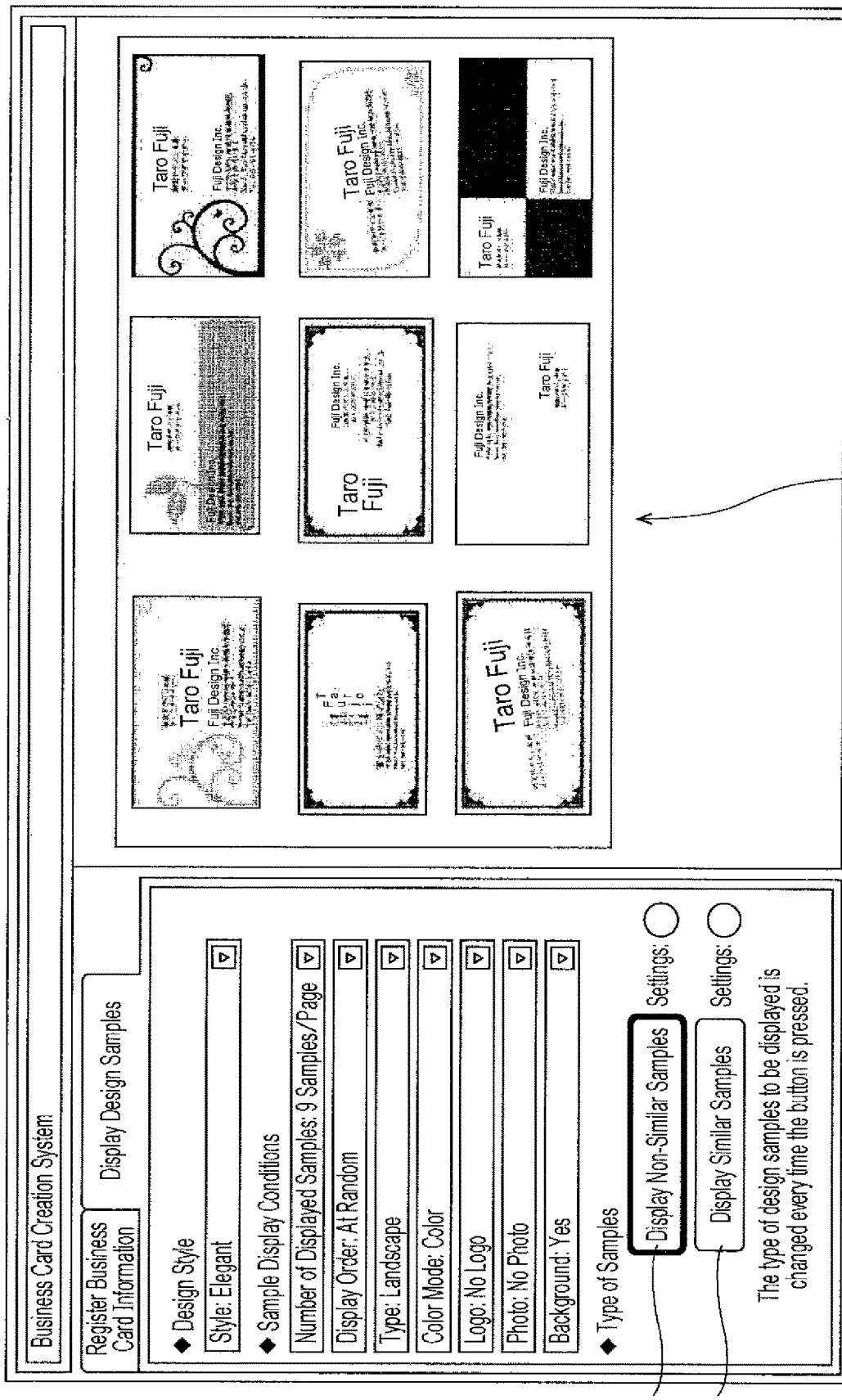
FIG. 9 illustrates an example of the design sample display screen.

An example of displayed design samples will be described next with reference to FIG. 9. FIG. 9 illustrates the design sample display screen 60. The design sample display screen 60 shows a non-similar sample display button 64 and a similar sample display button 66.

The non-similar sample display button 64 is a button used to instruct display of non-similar samples (design samples created using combinations of the matching design elements that meet the base style evoking criterion). In response to the user pressing the non-similar sample display button 64 after specifying the base style and the display conditions, information indicating a non-similar sample display instruction is transmitted from the terminal apparatus 12 to the design creation apparatus 10 via the communication channel N. The design creation apparatus 10 creates or searches for non-similar samples and transmits data of the non-similar samples to the terminal apparatus 12 via the communication channel N. In this way, a list 68 of non-similar samples is displayed in the design sample display screen 60.

The similar sample display button 66 is a button used to instruct display of similar samples (design samples similar to the specified design sample). In response to the user pressing the similar sample display button 66 after specifying a specific design sample (e.g., a non-similar sample), a list of similar samples similar to the specified design sample is displayed in the design sample display screen 60. Needless to say, a design sample other than a non-similar sample may be specified, and similar samples similar to the design sample may be displayed.

Figure 10:
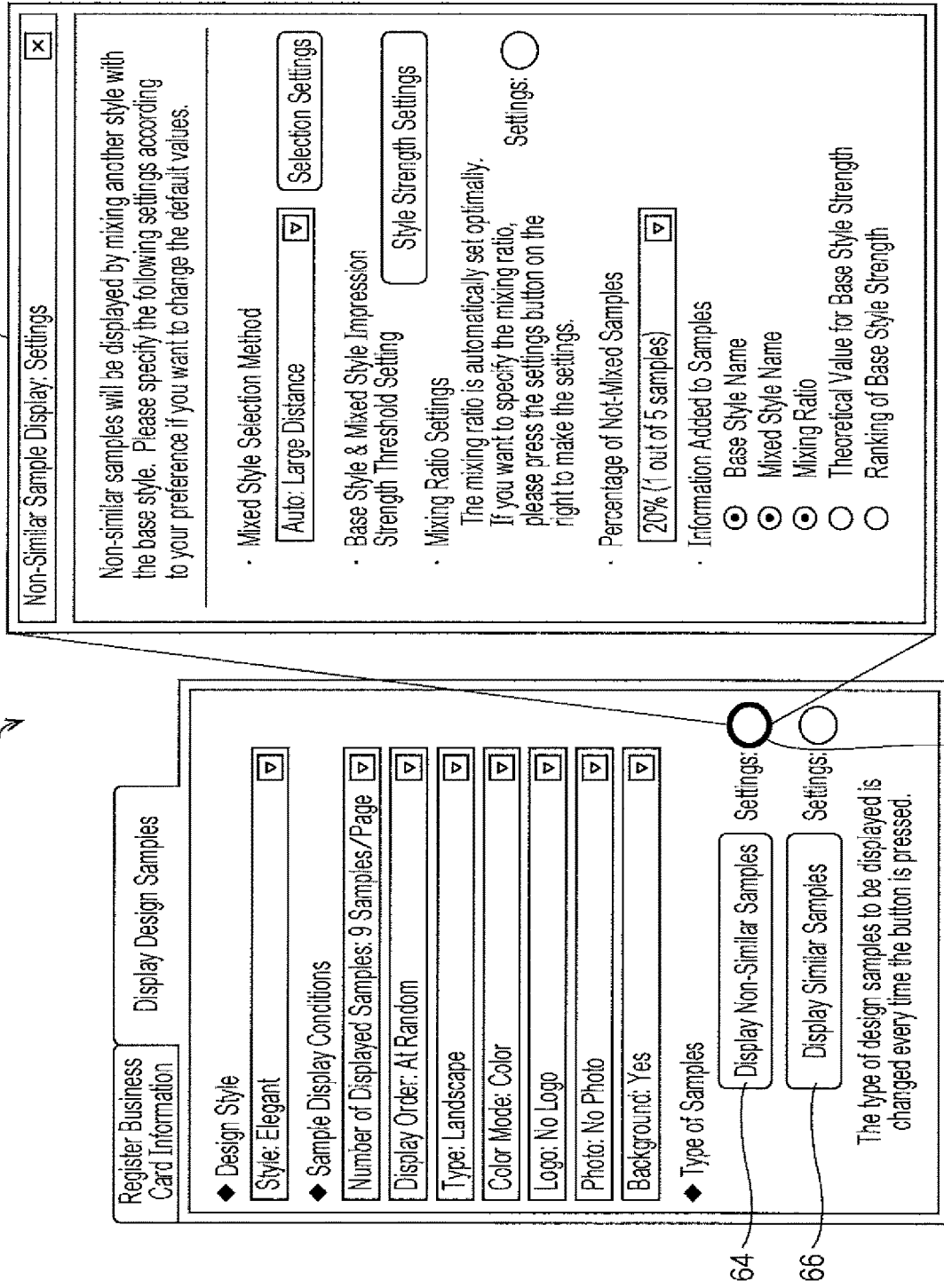
FIG. 10 illustrates an example of the design sample display screen.

Setting items used to display non-similar samples will be described next with reference to FIG. 10. FIG. 10 illustrates the design sample display screen 60. The design sample display screen 60 shows a settings button 70. In response to the user pressing this settings button 70, a window 72 for setting the non-similar sample creation conditions or the non-similar sample search conditions is displayed. In the design creation apparatus 10, the creation conditions or the search conditions are set by default in advance. If the user changes the creation conditions or the search conditions, the conditions are set in the design sample display screen 60.

The window 72 shows, as fields for setting the creation conditions or the search conditions, a field for selecting an auxiliary style selection method (Mixed Style Selection Method), a field for setting an impression strength threshold (evocation degree threshold), a field for setting the mixing ratio, a field for specifying information added to design samples, etc.

The auxiliary style selection method is a selection method carried out by the auxiliary style selection unit 26, and one of the first to third selection methods is selected by the user.

When none of the first to third selection methods are selected by the user, a default selection method is used.

The impression strength threshold (evocation degree threshold) is a value used by the determination unit 36. When the impression strength threshold is not specified by the user, a default value is used as the impression strength threshold.

The mixing ratio is a mixing ratio at which the perceptual scores of design elements are mixed. In response to the user specifying the mixing ratio, the mixed perceptual score computation unit 32 mixes the perceptual scores by using the mixing ratio specified by the user to compute a mixed perceptual score. When the mixing ratio is not specified by the user, the mixing ratio setting unit 30 automatically sets the mixing ratio, and the mixed perceptual score computation unit 32 computes the mixed perceptual score by using the mixing ratio set by the mixing ratio setting unit 30.

Examples of the information added to design samples include the base style name, the auxiliary style name (name of the mixed style), and the mixing ratio. In response to the user specifying these pieces of information, these pieces of information are also displayed together with the design sample.

In response to the user setting the creation conditions or the search conditions, information representing the conditions is transmitted from the terminal apparatus 12 to the design creation apparatus 10 via the communication channel N together with information indicating a non-similar sample display instruction. The design creation apparatus 10 then creates or search for non-similar samples in accordance with the creation conditions or the search conditions.

Processes performed by the design creation apparatus 10 will be described below.

Figure 11:
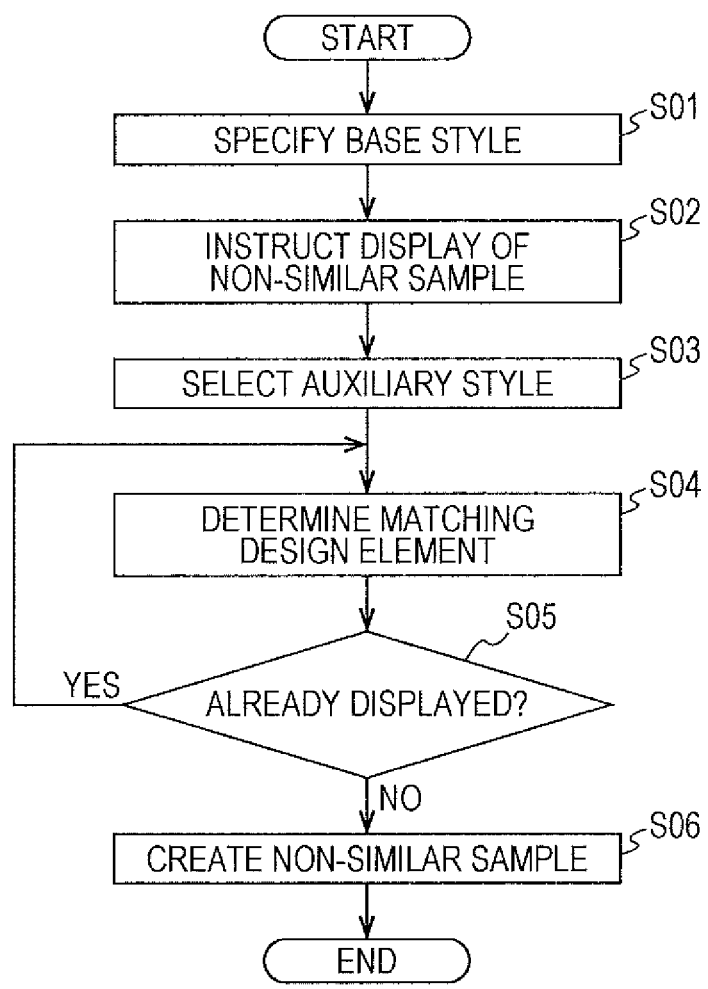
FIG. 11 is a flowchart illustrating an outline of a non-similar sample creation process.

An outline of a non-similar sample creation process will be described first with reference to FIG. 11. FIG. 11 is a flowchart illustrating the process. Hereinafter, it is assumed that non-similar samples are created for the target object "business card".

First, the user inputs the business card information and specifies the base style by using the terminal apparatus 12 (S01). For example, when the user accesses the design creation apparatus 10 by using the terminal apparatus 12, the business card information registration screen 54 illustrated in FIG. 7 and the design sample display screen 60 illustrated in FIG. 8 are displayed on the UI unit 46 of the terminal apparatus 12. The business card information registration screen 54 and the design sample display screen 60 are switched between in response to a switching operation, and one of them is displayed on the UI unit 46. The user inputs the business card information in the business card information registration screen 54 and specifies the base style (for example, the style "wild") in the design sample display screen 60. In addition, the user specifies the sample display conditions and the non-similar sample creation conditions or search conditions in the design sample display screen 60.

Then, the user inputs a non-similar sample display instruction by using the terminal apparatus 12 (S02). For example, in response to the user pressing the non-similar sample display button 64 shown in the design sample display screen 60, the non-similar sample display instruction is input. In response to this instruction, information indicating the non-similar sample display instruction, identification information for identifying the base style, and information representing the non-similar sample creation conditions or search conditions are transmitted from the terminal apparatus 12 to the design creation apparatus 10 via the communication channel N.

In the design creation apparatus 10, the auxiliary style selection unit 26 selects an auxiliary style in accordance with one of the first to third selection methods (S03), and the matching design element determination unit 28 determines a combination of matching design elements (S04).

If a non-similar sample having the combination of the matching design elements is already transmitted to and displayed on the terminal apparatus 12 (YES in S05), the matching design element determination unit 28 determines another combination of matching design elements (S04).

If a non-similar sample having the combination of the matching design elements is not transmitted to and not displayed on the terminal apparatus 12 yet (NO in S05), the design creation unit 38 creates a design sample, i.e., a non-similar sample, by using the combination of the matching design elements (S06). Alternatively, in the case where design samples are created and stored on the information storage unit 16 in advance, the design creation unit 38 may search the information storage unit 16 for a design sample having the combination of the matching design elements and may obtain the design sample as a non-similar sample from the information storage unit 16.

Data of the non-similar sample thus created or retrieved is transmitted from the design creation apparatus 10 to the terminal apparatus 12 via the communication channel N. The non-similar sample is then displayed on the UI unit 46 of the terminal apparatus 12. For example, the list 68 of non-similar samples is displayed as illustrated in FIG. 9. The non-similar sample may function as a template and may be edited by the user, for example. Specifically, a specific non-similar sample is selected from the list 68, and the font type, the layout of text, the color, the design, the business card information, and the like in the non-similar sample are edited by the user. In addition, in response to the user inputting a print instruction, the non-similar sample may be printed.

Figure 12:
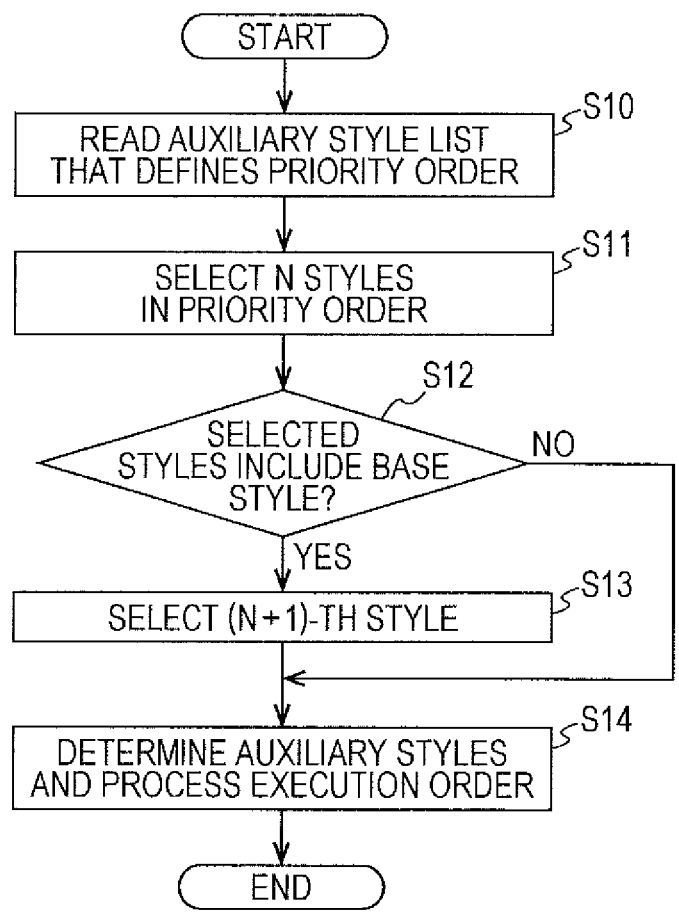
FIG. 12 is a flowchart illustrating an auxiliary style selection process.
Figure 13:
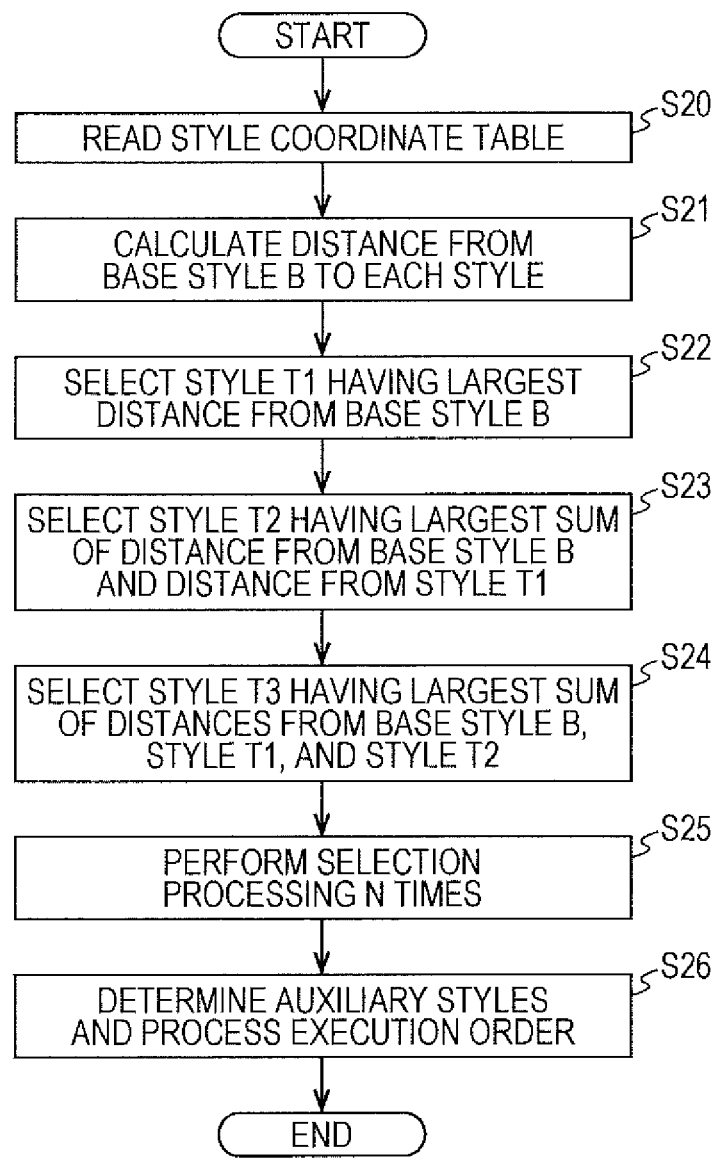
FIG. 13 is a flowchart illustrating another auxiliary style selection process.

Processes performed by the auxiliary style selection unit 26 will be described in detail next with reference to FIGS. 12 to 14.

A process according to the first selection method will be described with reference to FIG. 12. FIG. 12 is a flowchart illustrating the process. The first selection method is the fixed method.

First, the auxiliary style selection unit 26 reads an auxiliary style list for which the style priority order is defined (S10). This auxiliary style list is created in advance, and data of the auxiliary style list is stored in advance on the information storage unit 16, for example. In addition, the priority order is determined in advance. In the auxiliary style list, the priority rankings of the styles illustrated in FIG. 4 are defined, for example.

Then, the auxiliary style selection unit 26 selects N (N is an integer of 1 or greater) styles in accordance with the priority order from the auxiliary style list (S11). N may be a value set in advance or may be changed by the user.

If the N styles include the base style (YES in S12), the auxiliary style selection unit 26 removes the base style from the N styles and selects the style ranked at the (N+1)-th place from the auxiliary style list instead of the removed style (S13). In this way, N styles not including the base style are selected as the auxiliary styles.

If the N styles do not include the base style (NO in S12), the process proceeds to step S14. In this case, the N styles selected in step S11 are selected as the auxiliary styles.

In step S14, the auxiliary style selection unit 26 determines the N styles selected through the processing from step S11 to step S13, as the auxiliary styles, and determines the priority order of the N styles as an order in which processing is performed thereon by the matching design element determination unit 28.

A process according to the second selection method will be described next with reference to FIG. 13. FIG. 13 is a flowchart illustrating the process. The second selection method is a large distance method.

First, the auxiliary style selection unit 26 reads a style coordinate table (S20). The style coordinate table is created in advance, and data of the style coordinate table is stored in advance on the information storage unit 16. Style coordinate data is data representing coordinates of each style on the impression map 50 illustrated in FIG. 4, for example.

Then, the auxiliary style selection unit 26 calculates a distance from the base style B to each style (for example, a distance on the impression map 50) by referring to the style coordinate table (S21) and selects a style T1 having the largest distance from the base style B (S22).

Then, the auxiliary style selection unit 26 selects a style T2 having the largest sum of the distance from the base style B and the distance from the style T1 by referring to the style coordinate table (S23).

Further, the auxiliary style selection unit 26 selects a style T3 having the largest sum of the distances from the base style B, the style T1, and the style T3 (S24).

The auxiliary style selection unit 26 performs the above-described selection processing N times (S25). In this way, N styles (styles T1, T2, . . . , TN) are selected.

The auxiliary style selection unit 26 determines the N styles thus selected as the auxiliary styles, and determines the selection order of the N styles as an order in which processing is performed thereon by the matching design element determination unit 28 (S26). A style having a larger distance from the base style is assigned a higher rank.

A style having a larger distance from the base style on the impression map 50 has an impression that differs from the impression of the base style by a larger degree. Accordingly, a style having a relatively large impression difference from the base style is selected as the auxiliary style by selecting the auxiliary style in accordance with the second selection method. In addition, a style having the largest sum of the distances from the base style and from another auxiliary style is selected as another auxiliary style. In this way, multiple auxiliary styles having impressions different from one another are selected.

An example of information used as the style coordinate table will now be described with reference to FIG. 14. FIG. 14 illustrates an example of a factor loading that is a result of a factor analysis performed on each style. Factors that define the impression of each style are extracted and the factor loading is computed in advance. The larger the factor loading difference between styles, the larger the difference between impressions of the styles. Since this factor loading corresponds to coordinates on the impression map 50, the auxiliary styles may be selected by using the factor loading. Needless to say, the auxiliary styles may be selected by calculating the distance using the impression map 50 without using the factor analysis result. Alternatively, the auxiliary style selection unit 26 may select styles having the largest factor loading in the positive and negative directions as the auxiliary styles.

Figure 15:
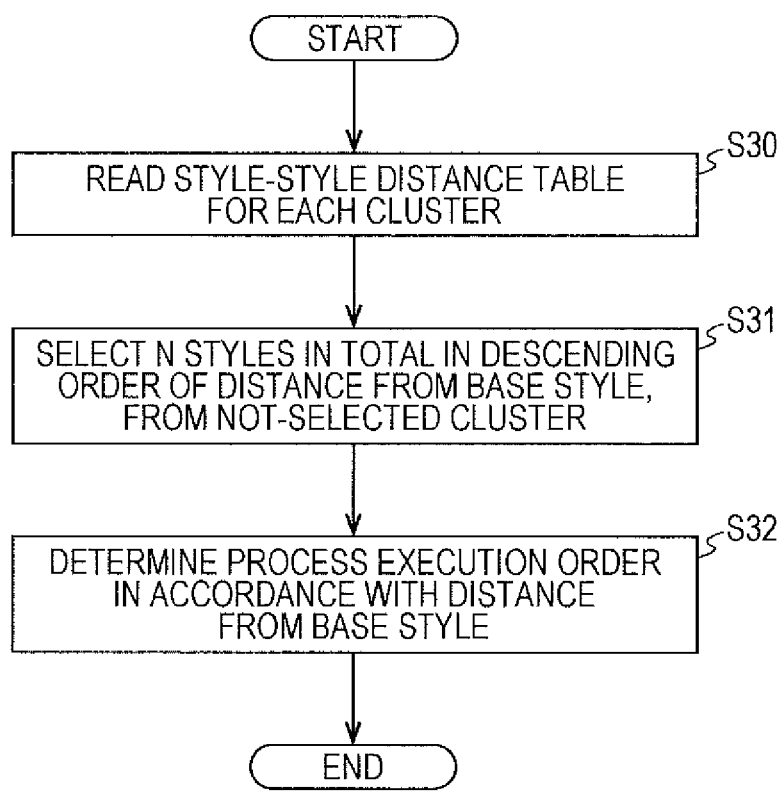
FIG. 15 is a flowchart illustrating another auxiliary style selection process.

A process according to the third selection method will be described next with reference to FIG. 15. FIG. 15 is a flowchart illustrating the process. The third selection method is a cluster-based large distance method.

First, the auxiliary style selection unit 26 reads a style-style distance table for each cluster (S30). Multiple styles are clustered in accordance with a criterion set in advance, and data representing the clusters is stored in advance on the information storage unit 16, for example. For example, styles having similar impressions are classified into the same cluster. The style-style distance table is created in advance for each cluster, and data of the style-style distance table is stored in advance on the information storage unit 16, for example. In the style-style distance table, a distance between the styles on the impression map 50 is defined. For example, the style-style distance table may be created by calculating a distance between styles on the impression map 50 illustrated in FIG. 4 or by calculating a distance between styles using the factor loading illustrated in FIG. 14.

Then, the auxiliary style selection unit 26 selects N styles in total from not-selected clusters in the descending order of the distance from the base style by referring to the style-style distance table for each cluster (S31).

Then, the auxiliary style selection unit 26 determines the N styles thus selected, as the auxiliary styles, and determines the order in which processing is performed thereon by the matching design element determination unit 28 in accordance with the distance from the base style (S32). The larger the distance from the base style, the higher the assigned rank.

The larger the distance from the base style, the larger the difference of the impression of the style from that of the base style. Accordingly, styles having a relatively large impression difference from the base style are selected as the auxiliary styles by selecting the auxiliary styles in accordance with the third selection method, as in the second selection method.

Figure 16:
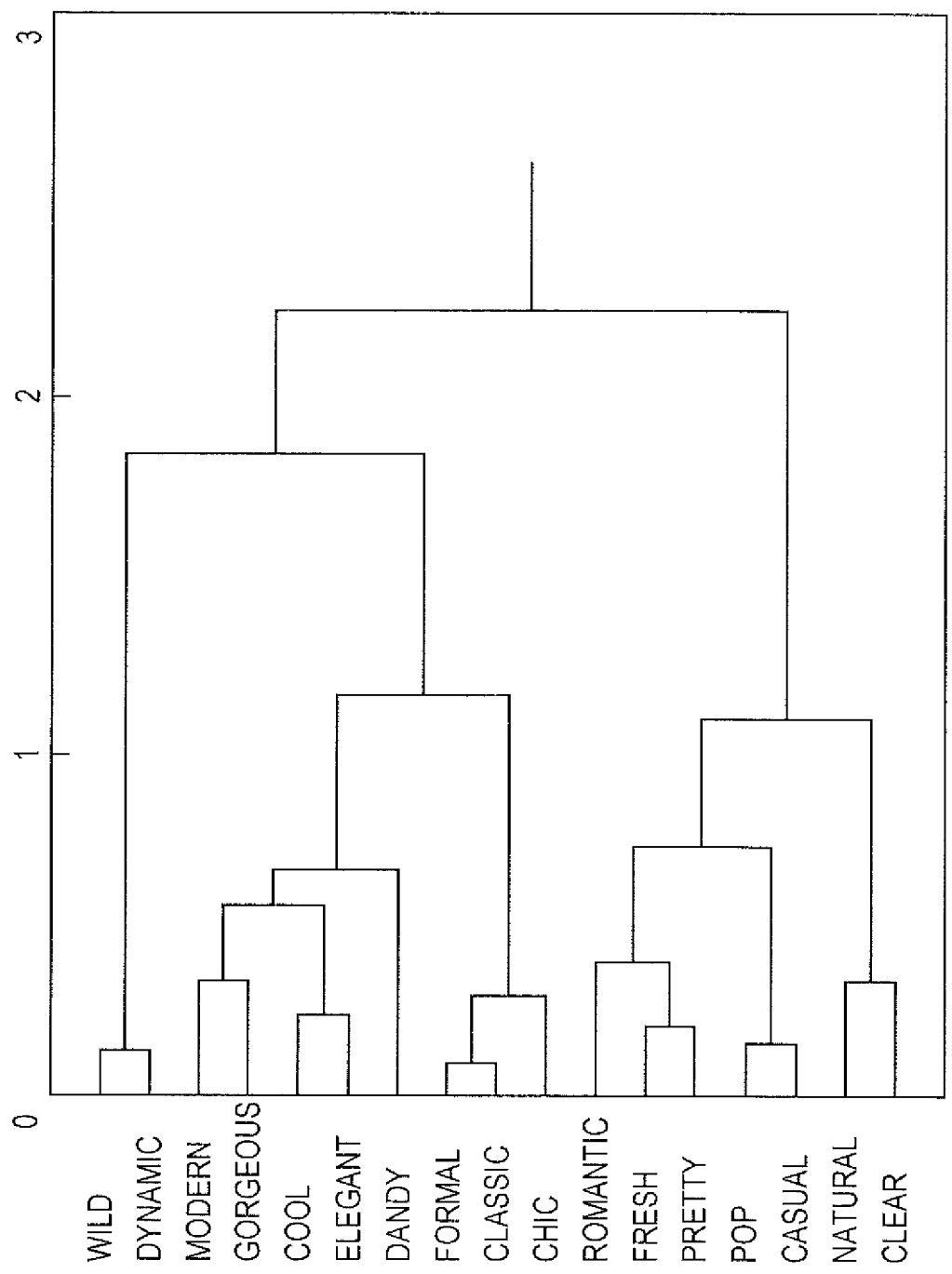
FIG. 16 illustrates an example of clustering of the style.

Clustering of styles will now be described with reference to FIG. 16. FIG. 16 illustrates an example of clustering of styles. In the example illustrated in FIG. 16, how clustering is performed is shown using a tree diagram. For example, styles having impressions similar to each other are classified into the same cluster. Data representing these clusters is stored in advance on the information storage unit 16.

FIG. 17 illustrates an example of a style-style distance table for each cluster. This style-style distance table is a table representing a distance between the base style "PRETTY" and each style in the case where "PRETTY" is specified as the base style. The auxiliary style selection unit 26 selects N styles in total from the clusters in the descending order of the distance from the base style by referring to this table.

One of the first to third selection methods is selected by the user in the design sample display screen 60 illustrated in FIG. 10, for example. If none of the first to third selection methods are selected by the user, the auxiliary style selection unit 26 selects the auxiliary styles in accordance with a selection method set in advance from among the first to third selection methods.

After the N auxiliary styles have been selected in the above-described manner, identification information (style IDs) for identifying the N auxiliary styles is output from the auxiliary style selection unit 26 to the matching design element determination unit 28, and the matching design element determination unit 28 performs processing. In this way, the combination of the matching design elements is determined.

Figure 18:
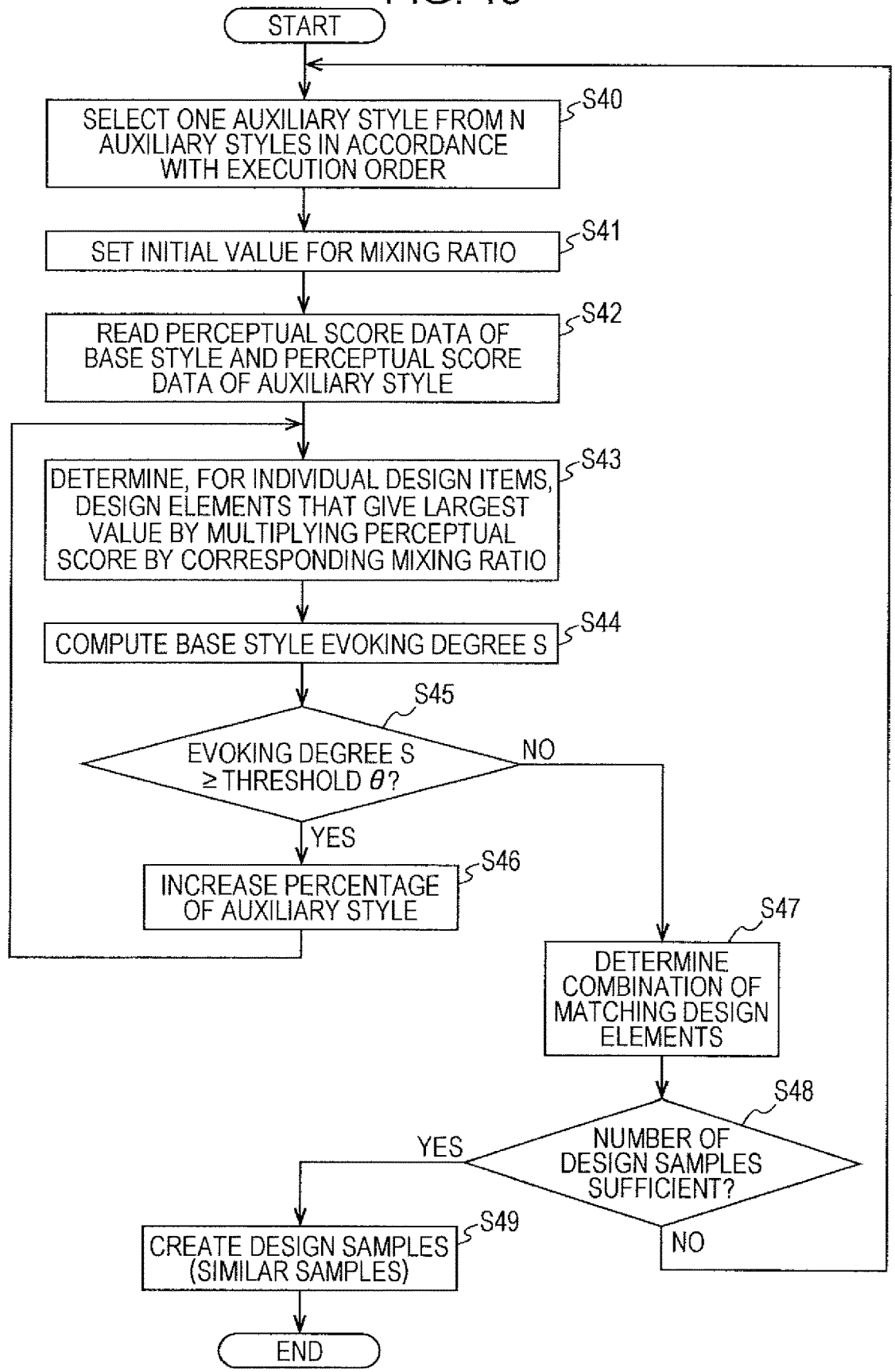
FIG. 18 is a flowchart illustrating a non-similar sample creation process.

A process performed by the matching design element determination unit 28 will be described below with reference to FIG. 18. FIG. 18 is a flowchart illustrating the process.

First, the mixed perceptual score computation unit 32 selects one auxiliary style from among the N auxiliary styles in accordance with the processing order (S40). This processing order is determined by the auxiliary style selection unit 26 as described above.

Then, an initial value is set for the mixing ratio for each design element (S41). If the mixing ratio is set by the user, this mixing ratio is used as the initial value. If the mixing ratio is not set by the user, the mixing ratio setting unit 30 sets the initial value for the mixing ratio. The initial value is set for the mixing ratio, for example, such that the percentage of the base style is 95% and the percentage of the auxiliary style is 5%.

Then, the mixed perceptual score computation unit 32 reads perceptual score data of the base style and perceptual score data of the auxiliary style from the perceptual score data DB 20 (S42).

Then, the mixed perceptual score computation unit 32 computes a mixed perceptual score for each design element by mixing a base perceptual score representing a degree of the design element contributing to evocation of the impression of the base style and an auxiliary perceptual score representing a degree of the design element contributing to evocation of the impression of the auxiliary style, with reference to the perceptual score data of the base style and the perceptual score data of the auxiliary style. Specifically, the mixed perceptual score computation unit 32 multiples the base perceptual score by the percentage (e.g., 0.95) of the base style in the mixing ratio and multiplies the auxiliary perceptual score by the percentage (e.g., 0.05) of the auxiliary style in the mixing ratio, and adds together the product of the base perceptual score and the percentage and the product of the auxiliary perceptual score and the percentage. In this way, the mixed perceptual score is determined. The mixed perceptual score computation unit 32 performs the computation process for each design element, thereby computing the mixed perceptual score for each design element. Then, the mixed perceptual score computation unit 32 determines, for each design item, as the largest-value design element, a design element having the largest mixed perceptual score (S43).

Then, the base style evoking degree computation unit 34 adds together the base perceptual scores of the largest-value design elements of all the design items, and computes a base style evoking degree S for the base style and the processing target auxiliary style on the basis of the sum (S44). For example, the base style evoking degree computation unit 34 computes the base style evoking degree S by adding a constant to the sum. The constant is a value set in advance. Note that the constant may be changed by the user. Alternatively, the base style evoking degree computation unit 34 may use the sum as the base style evoking degree S.

If the base style evoking degree S is greater than or equal to an evocation degree threshold θ (impression strength threshold θ) (YES in S45), the mixing ratio setting unit 30 increases the percentage of the auxiliary style in the mixing ratio by one step (S46). The process then returns to step S43. In step S43, the mixed perceptual score is computed for each design element in accordance with the new mixing ratio, and the largest-value design element is determined for each design item. The processing starting from step S44 is performed thereafter.

The mixing ratio setting unit 30 increases the percentage of the auxiliary style step by step (S46) until the base style evoking degree S becomes less than the evocation degree threshold θ, and the processing of steps S43 and S44 is performed.

Figure 19:
FIG. 19 illustrates an example of a mixing ratio.

A change in the mixing ratio will now be described with reference to FIG. 19. FIG. 19 illustrates an example of the mixing ratio. The initial value (1) of the mixing ratio is that the percentage of the base style is 95% and the percentage of the auxiliary style is 5%, for example. The mixing ratio setting unit 30 changes the mixing ratio step by step in a direction indicated by an arrow (direction from (2) toward (10)), for example. When the mixing ratio is changed by one step, the percentage of the base style and the auxiliary style changes by 5%. The mixing ratio setting unit 30 decreases the percentage of the base style by 5% and increases the percentage of the auxiliary style by 5%. In this way, the mixing ratio is changed step by step.

If the base style evoking degree S is greater than or equal to the evocation degree threshold θ, the mixing ratio setting unit 30 increases the percentage of the auxiliary style step by step, and the mixed perceptual score computation unit 32 computes the mixed perceptual score in accordance with the new percentage.

Referring back to FIG. 18, the description is continued. If the base style evoking degree S is less than the evocation degree threshold θ (NO in S45), the determination unit 36 determines the combination of the largest-value design elements for which the base style evoking degree S is greater than or equal to the evocation degree threshold θ, as the combination of the matching design elements (S47). More specifically, the determination unit 36 determines, as the combination of the matching design elements, a combination of largest-value design elements that is identified based on a computation performed using the mixing ratio in which the percentage of the auxiliary style is lower by one step than that in the mixing ratio for which the base style evoking degree S becomes less than the evocation degree threshold θ. For example, suppose that the base style evoking degree S is greater than or equal to the evocation degree threshold θ when the mixing ratio is a mixing ratio (2) (base style: 90%, auxiliary style: 10%) and that the base style evoking degree S becomes less than the evocation degree threshold θ when the mixing ratio is a mixing ratio (3) (base style: 85%, auxiliary style: 15%). In this case, the mixing ratio (2) preceding the mixing ratio (3) by one step is identified, and the determination unit 36 determines, as the combination of the matching design elements, a combination of largest-value design elements that is identified based on a computation performed using the mixing ratio (2). As described later, a design sample is created by using this combination of the matching design elements.

If the number of design samples is sufficient after the processing described above (YES in S48), that is, if combinations (M combinations) of matching design elements for creating a required number (M, where M is an integer of 1 or greater) of displayed design samples are determined, the process proceeds to step S49.

In contrast, if the number of design samples is insufficient (NO in S48), the process returns to step S40. In this case, the mixed perceptual score computation unit 32 selects an auxiliary style ranked at the next place from among the N auxiliary styles in accordance with the processing order in step S40. Thereafter, the above-described processing starting from step S41 is performed. The processing starting from step S40 is performed until M combinations are determined.

The number of displayed design samples (M) may be specified by the user by using the terminal apparatus 12 or may be set in advance. For example, if the user specifies the number of displayed design samples (M) in the design sample display screen 60 illustrated in FIG. 8, combinations of matching design elements for creating the number of displayed design samples are determined.

In step S49, the design creation unit 38 creates design samples, that is, non-similar samples, by using the combinations of the matching design elements. In this case, M non-similar samples are created by using the M combinations. Note that if design samples are created in advance and stored in advance on the information storage unit 16, the design creation unit 38 obtains design samples (non-similar samples) having the combinations of the matching design elements from the information storage unit 16.

Data of the non-similar samples is transmitted from the design creation apparatus 10 to the terminal apparatus 12 via the communication channel N, and the non-similar samples are displayed on the UI unit 46 of the terminal apparatus 12. For example, the list 68 of non-similar samples is displayed in the design sample display screen 60 illustrated in FIG. 9.

If an instruction to display the base style name, the auxiliary style name, and the mixing ratio is given, information representing them is also transmitted from the design creation apparatus 10 to the terminal apparatus 12 together with the data of the non-similar samples and is displayed on the UI unit 46 of the terminal apparatus 12.

The process performed by the matching design element determination unit 28 will be described below with reference to FIGS. 20 and 21 by using a specific example. FIGS. 20 and 21 illustrate an example of perceptual score data, i.e., examples of the perceptual score for the base style, the perceptual score for the auxiliary style, and the mixed perceptual scores.

It is assumed that the style "pretty" is specified as the base style and that the style "dynamic" is selected as the auxiliary style, for example. It is also assumed that the mixing ratio is set such that the percentage of the base style is 50% and the percentage of the auxiliary style is 50%.

In FIGS. 20 and 21, the perceptual score (base perceptual score) of each design element for the base style "pretty" is shown at a column 74. The perceptual score (auxiliary perceptual score) of each design element for the auxiliary style "dynamic" is shown at a column 76. The mixed perceptual score of each design element is shown at a column 78.

The mixed perceptual score computation unit 32 mixes, for each design element, the base perceptual score and the auxiliary perceptual score. Specifically, the mixed perceptual score computation unit 32 multiplies the base perceptual score by the percentage (0.5) and multiplies the auxiliary perceptual score by the percentage (0.5) and adds together the product of the base perceptual score and the percentage and the product of the auxiliary perceptual score and the percentage. In this way, the mixed perceptual score is determined.

The description will be given by using a specific example. A design element "1: SPIRAL TREE" belongs to the design item "BACKGROUND DESIGN". The perceptual score of the design element "1: SPIRAL TREE" for the base style "PRETTY" is "0.77", whereas the perceptual score of the design element "1: SPIRAL TREE" for the auxiliary style "DYNAMIC" is "−0.10". Accordingly, the mixed perceptual score of the design element "1: SPIRAL TREE" is calculated using the following equation.

Mixed Perceptual Score=0.77×0.5+(−0.1)×0.5=0.335

The mixed perceptual score is computed for each of the other design elements. The mixed perceptual scores thus computed are shown at the column 78.

The mixed perceptual score computation unit 32 also selects, for each design item, a design element having the largest mixed perceptual score as a largest-value design element. The description will be given by using a specific example. As for the design item "BACKGROUND DESIGN", the mixed perceptual score of the design element "8: CHERRY BLOSSOMS" is "0.35", which is the largest among the design elements belonging to the design item "BACKGROUND DESIGN". Accordingly, the design element "8: CHERRY BLOSSOMS" is selected as the largest-value design element. The largest-value design element is selected for each of the other design items. In the example illustrated in FIGS. 20 and 21, the design elements enclosed by dotted lines correspond to the largest-value design elements. If there are multiple largest-value design elements for a single design item (multiple design elements having the same largest mixed perceptual score), one of the multiple largest-value design elements may be selected or the largest-value design element assigned the smallest ID number may be selected.

Once the largest-value design elements are determined in the above manner, the base style evoking degree computation unit 34 adds together the base perceptual scores of the largest-value design elements of all the design items and computes the base style evoking degree S relating to the base style "pretty" and the auxiliary style "dynamic" on the basis of the sum.

In the example illustrated in FIGS. 20 and 21, the following design elements are selected as the largest-value design elements.
Design item "BACKGROUND DESIGN": Design element "8: CHERRY BLOSSOMS" (base perceptual score=0.76)
Design item "DISTRIBUTION OF TEXT ELEMENTS": Design element "8: RADIAL ALIGNMENT" (base perceptual score=0.08)
Design item "NAME FONT": Design element "4: KARAT" (base perceptual score=0.10)
Design item "NAME TYPING DIRECTION": Design element "2: VERTICAL" (base perceptual score=0.05)
Design item "NAME VERTICAL ALIGNMENT": Design element "2: TOP-CENTER" (base perceptual score=0.02)
Design item "NAME HORIZONTAL ALIGNMENT": Design element "1: LEFT" (base perceptual score=0.01)
Design item "NAME FORM": Design element "2: OBLIQUE LINE" (base perceptual score=0.06)
Design item "NAME SIZE": Design element "4: 31≤SIZE" (base perceptual score=0.02)
Design item "COMPANY NAME TYPING DIRECTION": Design element "1: HORIZONTAL" (base perceptual score=0.02)
Design item "COMPANY NAME VERTICAL ALIGNMENT": Design element "2: TOP-CENTER" (base perceptual score=0.03)
Design item "COMPANY NAME HORIZONTAL ALIGNMENT": Design element "3: CENTER" (base perceptual score=0.03)
Design item "COMPANY NAME SIZE": Design element "1: SIZE<9" (base perceptual score=0.10)

In the example above, the sum of the base perceptual scores of the largest-value design elements of all the design items is calculated as follows.

Sum=0.76+0.08+0.10+0.05+0.02+0.01+0.06+0.02+0.02+0.03+0.03+0.10=1.28

The base style evoking degree computation unit 34 adds a constant (e.g., "1.25") to the sum "1.28". In this way, the base style evoking degree S (1.28+1.25=2.53) is determined. The constant "1.25" may be changed by the user.

The base style evoking degree S corresponds to a value representing a degree of the combination of the largest-value design elements of all the design items contributing to evocation of the impression of the base style (impression strength value). The larger the base style evoking degree S, the larger the contribution of the combination of the largest-value design elements to evocation of the impression of the base style.

A relationship between the base style evoking degree S and the degree of contributing to evocation of the impression of the base style is as follows, for example.

When the base style evoking degree S is equal to 1, the impression of the base style is not evoked at all.

When the base style evoking degree S is equal to 2, the impression of the base style is not evoked much.

When the base style evoking degree S is equal to 3, the impression of the base style is evoked a little.

When the base style evoking degree S is equal to 4, the impression of the base style is evoked much.

When the base style evoking degree S is equal to 5, the impression of the base style is evoked very much.

For example, if the base style evoking degree S is equal to "1", the degree of contribution to evocation of the impression of the base style is very low. When a design sample is created using a combination of the largest-value design elements having that base style evoking degree S, people do not feel the impression of the base style from the design sample at all.

If the base style evoking degree S is equal to "2", the degree of contribution to evocation of the impression of the base style is low. When a design sample is created using a combination of the largest-value design elements having that base style evoking degree S, people do not feel the impression of the base style from the design sample much.

If the base style evoking degree S is equal to "3", the degree of contribution to evocation of the impression of the base style is intermediate. When a design sample is created using a combination of the largest-value design elements having that base style evoking degree S, people feel the impression of the base style from the design sample a little.

If the base style evoking degree S is equal to "4", the degree of contribution to evocation of the impression of the base style is high. When a design sample is created using a combination of the largest-value design elements having that base style evoking degree S, people feel the impression of the base style from the design sample much.

If the base style evoking degree S is equal to "5", the degree of contribution to evocation of the impression of the base style is very high. When a design sample is created using a combination of the largest-value design elements having that base style evoking degree S, people feel the impression of the base style from the design sample very much.

The base style evoking degree S determined in the above manner is compared with the evocation degree threshold $\theta$ (S45 in FIG. 18). The combination of the matching design elements is determined in accordance with the comparison result (S47 in FIG. 18)

The evocation degree threshold $\theta$ is set such that a design sample (non-similar sample) created using the combination of the matching design elements mainly evokes the impression of the base style and additionally evokes the impression of the auxiliary style.

A design sample is created as a non-similar sample by using the combination of the matching design elements (S49). If design samples are created in advance and stored in advance on the information storage unit 16, the information storage unit 16 may be searched for a design sample having the combination of the matching design elements and the design sample may be obtained as the non-similar sample from the information storage unit 16. Data of the created or retrieved design sample is transmitted from the design creation apparatus 10 to the terminal apparatus 12. The non-similar sample is then displayed on the UI unit 46 of the terminal apparatus 12. For example, the list 68 of non-similar samples is displayed on the terminal apparatus 12 as illustrated in FIG. 9. A non-similar sample is selected from the list 68 by the user, and processing such as editing and printing is performed on the non-similar sample.

As described above, in accordance with the first exemplary embodiment, a design sample is created using a combination of optimum design elements having the base style evoking degree S that is greater than or equal to the evocation degree threshold $\theta$. Accordingly, a design sample (non-similar sample) that mainly evokes the impression of the base style (e.g., "pretty") and additionally evokes the impression of the auxiliary style (e.g., "dynamic") is created.

In addition, the base style evoking degree S is computed while increasing the percentage of the auxiliary style in the mixing ratio step by step, that is, while decreasing the percentage of the base style in the mixing ratio step by step, and the mixing ratio in which the percentage of the auxiliary style is lower by one step than that of the mixing ratio for which the base style evoking degree S becomes less than the evocation degree threshold $\theta$ is identified. A combination of the largest-value design elements identified through the computation performed using the identified mixing ratio is determined as the combination of the matching design elements, and a design sample is created using this combination of the matching design elements. Accordingly, a design sample that mainly evokes the impression of the base style (e.g., "pretty") and additionally evokes the impression of the auxiliary style (e.g., "dynamic") more strongly than in the case where a design sample is created by determining, as the combination of the matching design elements, every combination of largest-value design elements for which the base style evoking degree S is greater than or equal to the evocation degree threshold $\theta$.

In addition, by using a style having an impression more different from an impression of the base style as the auxiliary style, a design sample that mainly evokes the impression of the base style and additionally evokes an impression different from that of the base style is created, compared with the case where a style having an impression less different from the impression of the base style is used as the auxiliary style. For example, by using a style having an impression for which a difference from the impression of the base style is the largest as the auxiliary style, a design sample that mainly evokes the impression of the base style and additionally evokes an impression more different from that of the base style is created. In addition, multiple auxiliary styles having impressions different from one another are selected in accordance with the second selection method described above. By creating multiple design samples (non-similar samples) using these multiple auxiliary styles, multiple non-similar samples that mainly evoke the impression of the base style and that look differently from one another are created and provided.

A design sample having a single base style may be created, and the design sample may be provided to and displayed on the terminal apparatus 12 together with design samples (non-similar samples) each created using the base style and an auxiliary style.

Figure 22:
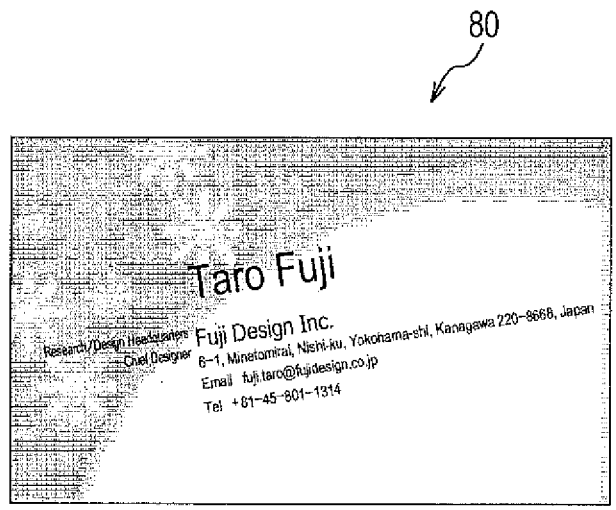
FIG. 22 illustrates an example of a design sample.
Figure 23:
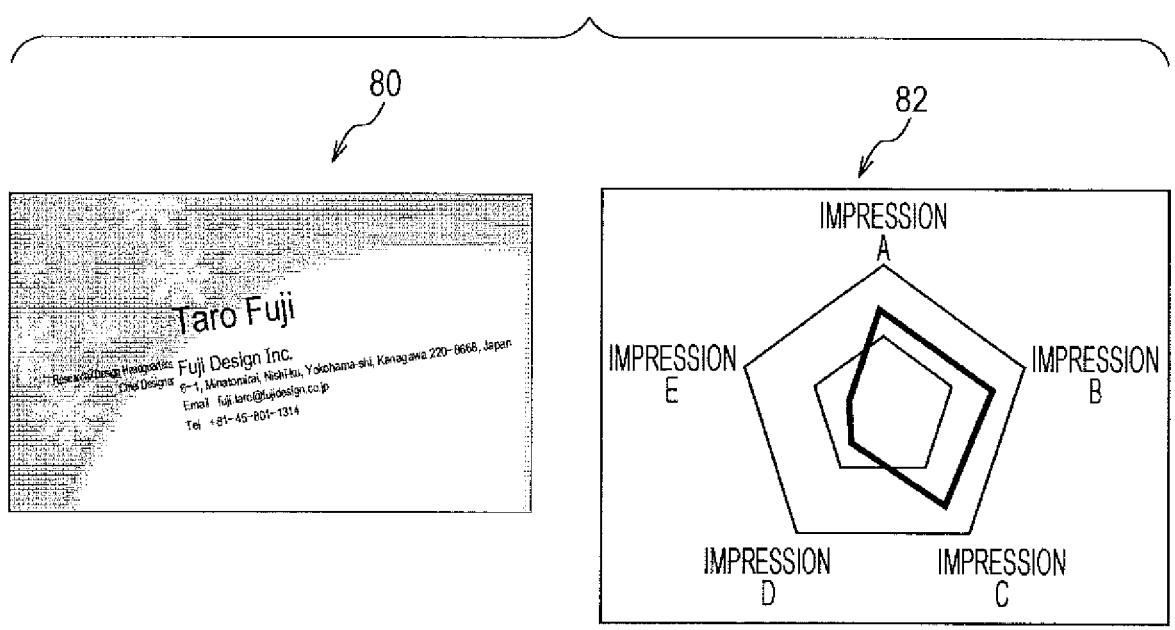
FIG. 23 illustrates an example of the design sample.

If an instruction to display the base style name, the auxiliary style name, and the mixing ratio is given, information regarding these is also transmitted from the design creation apparatus 10 to the terminal apparatus 12 together with data of the design samples and is displayed on the UI unit 46 of the terminal apparatus 12. For example, the name of the base style "pretty", the percentage of the base style "75%", the name of the auxiliary style "dynamic", and the percentage of the auxiliary style "25%" are displayed together with a design sample 80, as illustrated in FIG. 22. In this way, information to be referred to by the user when the user selects a design sample (non-similar sample) is provided.

In addition, an impression profile 82 that represents an impression analysis result of the design sample 80 may be displayed on the UI unit 46 of the terminal apparatus 12 together with the design sample 80. The impression profile 82 is information that represents the strength of each impression of the design sample 80. The impression profile 82 is created by the design creation apparatus 10 and is transmitted to the terminal apparatus 12.

First Modification

Figure 24:
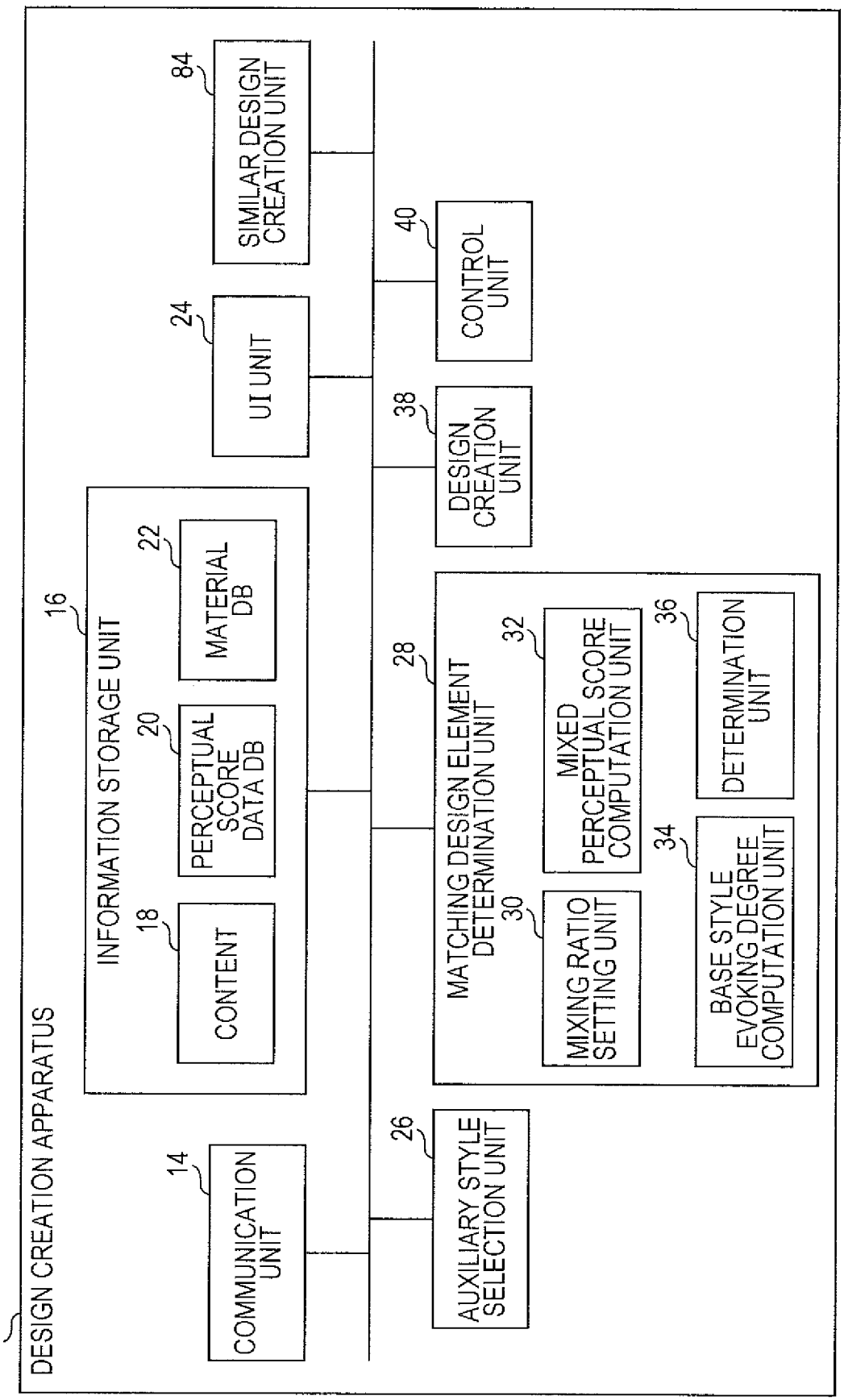
FIG. 24 is a block diagram illustrating a design creation apparatus according to a first modification.

A design creation apparatus 10A according to a first modification will be described below. FIG. 24 illustrates an example of the design creation apparatus 10A according to the first modification. The design creation apparatus 10A according to the first modification further includes a similar design creation unit 84 in addition to the components of the design creation apparatus 10 according to the first exemplary embodiment described above. The configuration of the design creation apparatus 10A is the same as the configuration of the design creation apparatus 10 according to the first exemplary embodiment described above except for the similar design creation unit 84.

The similar design creation unit 84 creates a design sample (similar sample) that is similar to a selected design sample.

The first modification will be described in detail below.

Figure 25:
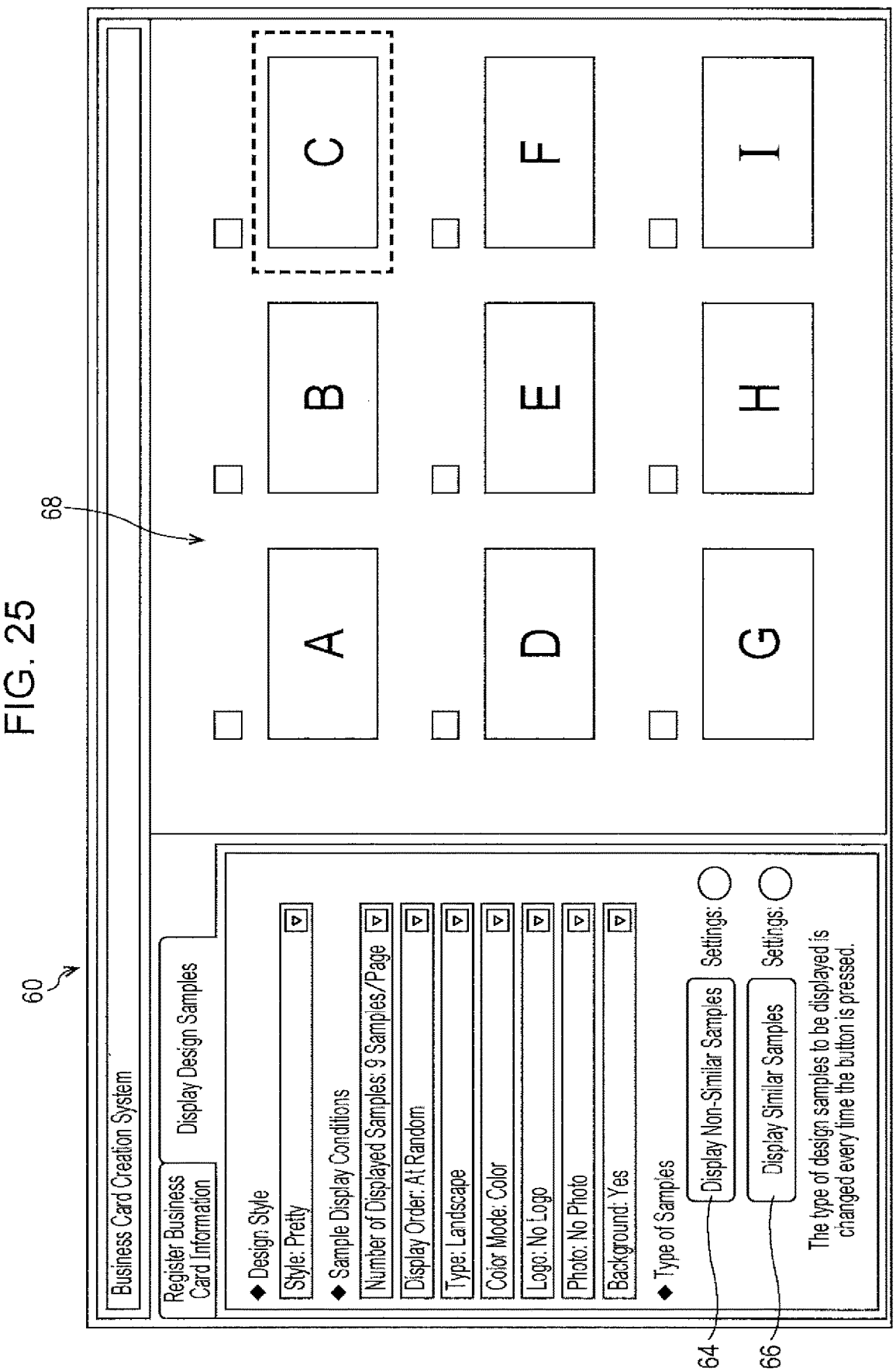
FIG. 25 illustrates an example of a design sample display screen.

FIG. 25 illustrates the design sample display screen 60. In response to the user pressing the non-similar sample display button 64, the design creation apparatus 10A creates or searches for design samples, which are non-similar samples, and the list 68 of the created or retrieved design samples (non-similar samples) is displayed in the design sample display screen 60 as described above. In the example illustrated in FIG. 25, nine design samples (design samples A to I) are displayed as non-similar samples.

In response to the user pressing the similar sample display button 66 after specifying a specific design sample (non-similar sample) by using the terminal apparatus 12, information indicating a similar sample display instruction and identification information (sample ID) for identifying the specified non-similar sample are transmitted from the terminal apparatus 12 to the design creation apparatus 10A via the communication channel N.

In the design creation apparatus 10A, the similar design creation unit 84 creates a design sample (similar sample) that is similar to the specified non-similar sample. For example, one or multiple similar samples are created. Data of the similar samples is transmitted from the design creation apparatus 10A to the terminal apparatus 12 via the communication channel N, and the similar samples are displayed on the UI unit 46 of the terminal apparatus 12.

Figure 26:
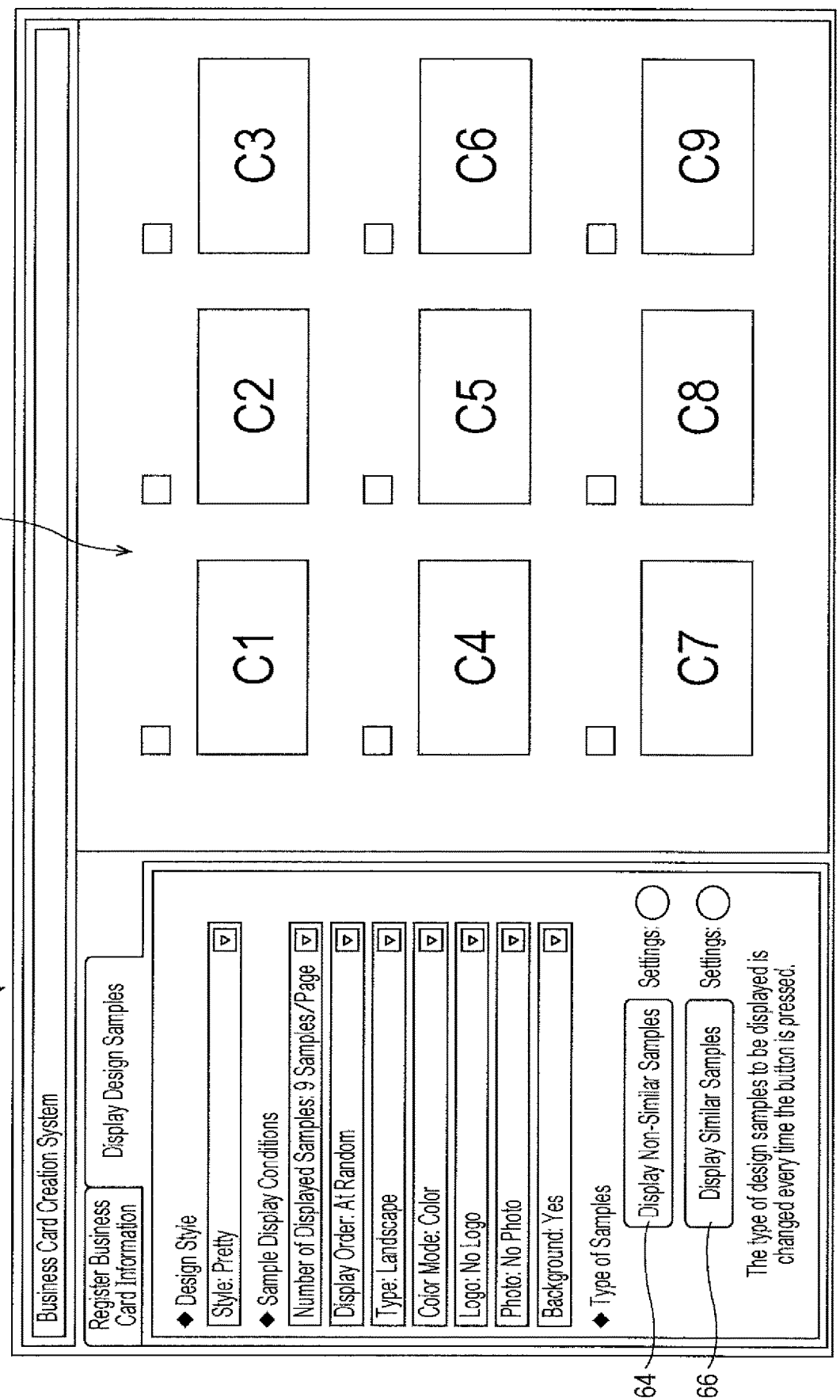
FIG. 26 illustrates an example of the design sample display screen.

For example, a list 86 of similar samples is displayed in the design sample display screen 60 as illustrated in FIG. 26. For example, when the design sample C is selected, design samples (C1 to C9) similar to the design sample C are created and displayed as similar samples.

Figure 27:
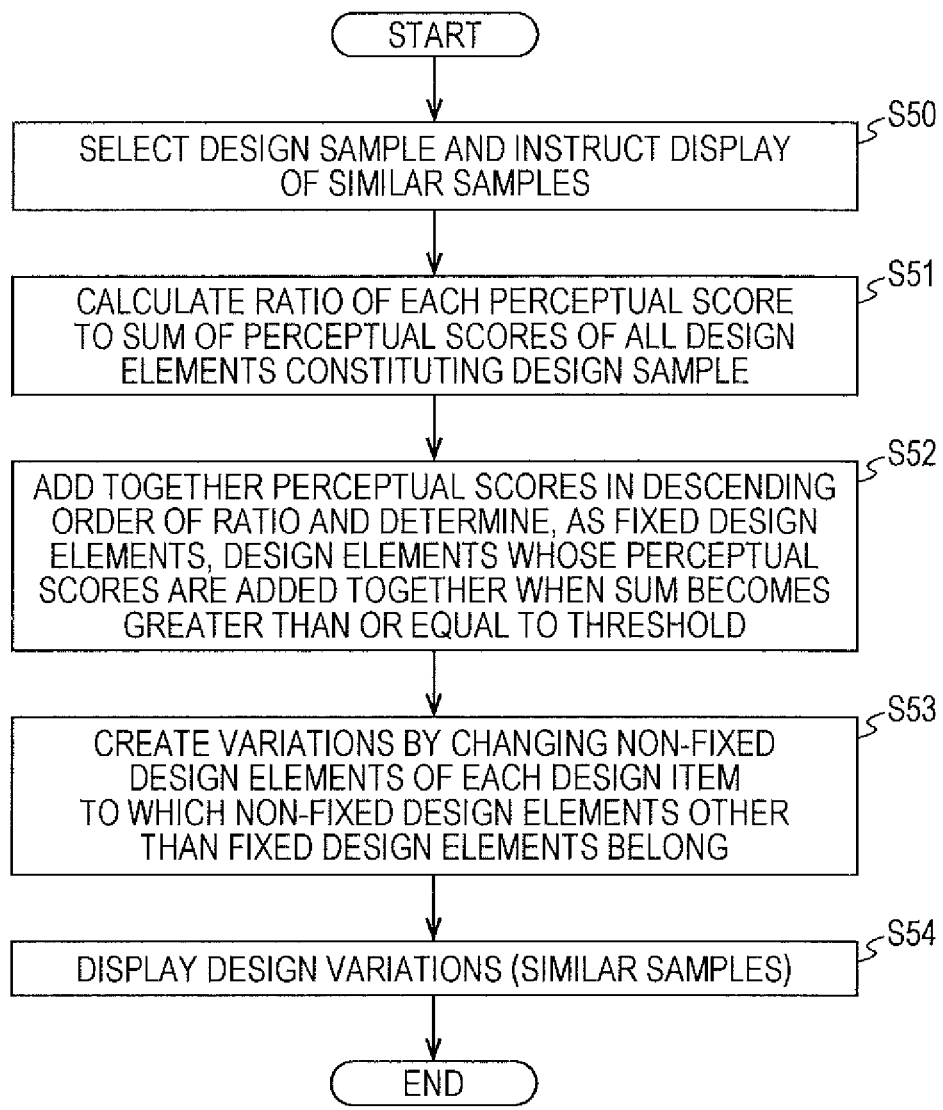
FIG. 27 is a flowchart illustrating a similar sample creation process.

A process performed by the similar design creation unit 84 will be described in detail below with reference to FIG. 27. FIG. 27 is a flowchart illustrating the process.

It is assumed that the design sample display screen 60 illustrated in FIG. 25 is displayed on the UI unit 46 of the terminal apparatus 12. The user selects a specific design sample from the list 68 of the design samples (non-similar samples) displayed in the design sample display screen 60 and presses the similar sample display button 66 by using the UI unit 46 (S50).

In response to pressing of the similar sample display button 66, information indicating a similar sample display instruction and identification information (sample ID) for identifying the design sample selected by the user are transmitted from the terminal apparatus 12 to the design creation apparatus 10A via the communication channel N.

In the design creation apparatus 10A, the similar design creation unit 84 adds together perceptual scores of all design elements that constitute the design sample selected by the user and calculates the percentages of the perceptual scores of the respective design elements relative to the sum (S51).

Then, the similar design creation unit 84 adds together the perceptual scores of the design elements in descending order of the percentage, and determines, as fixed design elements, design elements whose perceptual scores are added together when the sum becomes greater than or equal to a threshold (S52). The threshold may be a value set in advance or may be changed by the user.

Then, the similar design creation unit 84 creates design variations, which are similar samples, without changing the fixed design elements but by changing design elements (non-fixed design elements) other than the fixed design elements of design items to which the non-fixed design elements belong (S53). In this way, design variations that include the fixed design elements and different non-fixed design elements are created. At that time, the similar design creation unit 84 creates a specified number of design variations (similar samples). The specified number may be a value set in advance or a value specified by the user.

Data of the similar samples (design variations) is transmitted from the design creation apparatus 10A to the terminal apparatus 12, and the list 86 of similar samples is displayed on the UI unit 46 of the terminal apparatus 12 as illustrated in FIG. 26 (S54).

Figure 28:
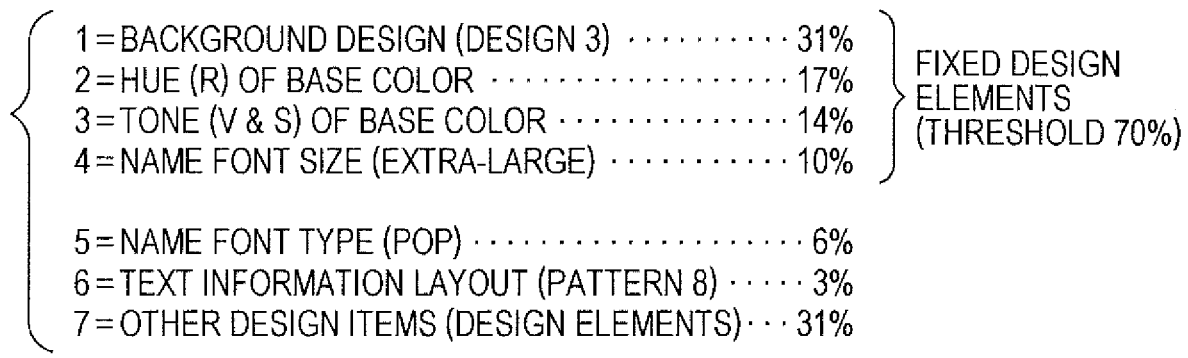
FIG. 28 illustrates examples of design items and design elements.

The process performed by the similar design creation unit 84 will be described below by using a specific example. It is assumed that a specific design sample X is selected by the user from the list 68 of design samples (non-similar samples), for example. FIG. 28 illustrates design items that constitute the design sample X and their design elements. The design sample X is constituted by design items "1. BACKGROUND DESIGN", "2. HUE OF BASE COLOR", "3. TONE OF BASE COLOR", "4. NAME FONT SIZE", "5. NAME FONT TYPE", "6. TEXT INFORMATION LAYOUT", and "7. OTHER DESIGN ITEMS".

The design element "DESIGN 3" is selected as the design item "1. BACKGROUND DESIGN". The percentage of the perceptual score of the design element "DESIGN 3" relative to the sum of perceptual scores of all the design elements that constitute the design sample X is "31%".

The design element "R" is selected as the design item "2. HUE OF BASE COLOR". The percentage of the perceptual score of the design element "R" relative to the sum of perceptual scores is "17%".

The design element "V & S" is selected as the design item "3. TONE OF BASE COLOR". The percentage of the perceptual score of the design element "V & S" relative to the sum of perceptual scores is "14%".

The design element "EXTRA-LARGE" is selected as the design item "4. NAME FONT SIZE". The percentage of the perceptual score of the design element "EXTRA-LARGE" relative to the sum of perceptual scores is "10%".

The design element "POP" is selected as the design item "5. NAME FONT TYPE". The percentage of the perceptual score of the design element "POP" relative to the sum of perceptual scores is "6%".

The design element "PATTERN 8" is selected as the design item "6. TEXT INFORMATION LAYOUT". The percentage of the perceptual score of the design element "PATTERN 8" relative to the sum of perceptual scores is "3%".

The sum of the percentages of the perceptual scores of "7. OTHER DESIGN ITEMS" relative to the sum of perceptual scores is "31%".

It is assumed that the threshold is 70%, for example. The similar design creation unit 84 adds together the perceptual scores of the design elements in the descending order of the percentage and determines, as the fixed design elements, design elements whose perceptual scores are added together when the sum becomes greater than or equal to the threshold "70%". In the example illustrated in FIG. 28, the similar design creation unit 84 adds together the perceptual scores of the design elements in an order of the background design "DESIGN 3", the hue of the base color "R", the tone of the base color "V & S", and the name font size "EXTRA-LARGE". When the percentage of the name font size "EXTRA-LARGE" is added, the sum becomes greater than or equal to the threshold "70%". Accordingly, the similar design creation unit 84 determines the design elements "DESIGN 3", "R", "V & S", and "EXTRA-LARGE" as the fixed design elements. Also, the design elements "POP", "PATTERN 8", and the "OTHER DESIGN ELEMENTS" are determined as the non-fixed design elements.

Figure 29:
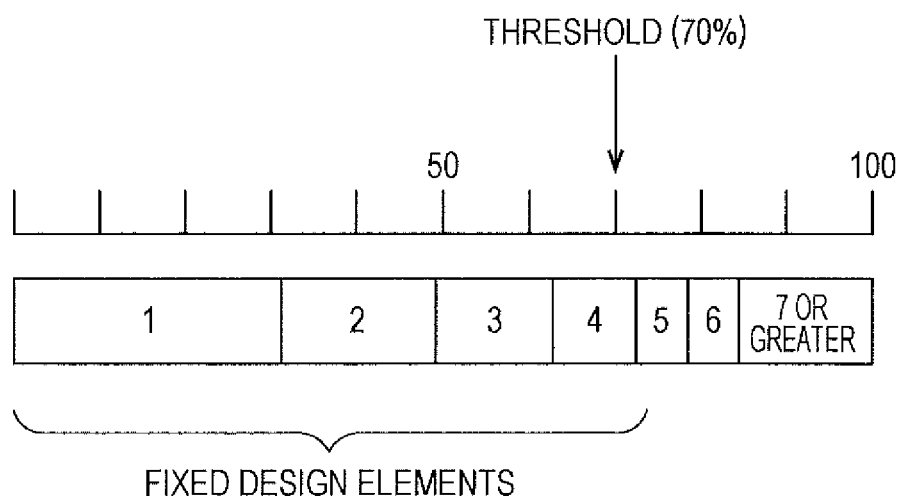
FIG. 29 schematically illustrates a perceptual score summing process.

FIG. 29 schematically illustrates the summing process. The sum of the percentages of the perceptual scores of the design items from "1. BACKGROUND DESIGN" to "4. NAME FONT SIZE" is greater than or equal to the threshold "70%".

Once the fixed design elements are determined in the above manner, the similar design creation unit 84 creates design variations, which are similar samples, without changing the fixed design elements but by changing the non-fixed design elements of the design items to which the non-fixed design elements belong. In the example illustrated in FIG. 28, the similar design creation unit 84 changes the non-fixed design elements while keeping the fixed design elements (i.e., the background design "DESIGN 3", the hue of the base color "R", the tone of the base color "V & S", and the name font size "EXTRA-LARGE") unchanged. Specifically, the similar design creation unit 84 creates design variations by changing the non-fixed design items belonging to the design item "NAME FONT TYPE" ranked at the fifth place while keeping the fixed design elements and the non-fixed design elements ranked at the sixth and lower places unchanged. That is, the similar design creation unit 84 creates design samples (design variations) by using the fixed design elements, the non-fixed design elements ranked at the sixth and lower places, and the non-fixed design element ranked at the fifth place while changing the non-fixed design element belonging to the design item "NAME FONT TYPE" ranked at the fifth place. The similar design creation unit 84 creates multiple design variations (similar samples) in which the fixed design elements and the non-fixed design elements ranked at the sixth and lower places are kept unchanged but the design element ranked at the fifth place alone is changed, by combining each one of the design elements (e.g., HELVETICA, MYRIAD PRO, and GLASGOW) belonging to the design item ranked at the fifth place with the fixed design elements and the non-fixed design elements ranked at the sixth and lower places. Data of the multiple design variations (similar samples) in which the non-fixed design element ranked at the fifth place alone is changed is transmitted from the design creation apparatus 10A to the terminal apparatus 12. The list 86 of the multiple design variations (similar samples) is displayed on the UI unit 46 of the terminal apparatus 12 as illustrated in FIG. 26.

Likewise, the similar design creation unit 84 creates design variations by changing the non-fixed design element belonging to the design item "TEXT INFORMATION LAYOUT" ranked at the sixth place while keeping the fixed design elements and the non-fixed design elements ranked at places other than the sixth place unchanged. Specifically, the similar design creation unit 84 creates design samples (design variations) using the fixed design elements, the non-fixed design elements ranked at places other than the sixth place, and the non-fixed design element ranked at the sixth place while changing the non-fixed design element belonging to the design item "TEXT INFORMATION LAYOUT" ranked at the sixth place. The similar design creation unit 84 creates multiple design variations (similar samples) in which the fixed design elements and the non-fixed design elements ranked at places other than the sixth place are kept unchanged and the non-fixed design element ranked at the sixth place alone is changed, by combining every design element (e.g., PATTERNS 1 to 11) belonging to the design item ranked at the sixth place with the fixed design elements and the non-fixed design elements ranked at places other than the sixth place, for example. Data of the multiple design variations (similar samples) in which the non-fixed design element ranked at the sixth place alone is changed is transmitted from the design creation apparatus 10A to the terminal apparatus 12. The list 86 is displayed on the UI unit 46 of the terminal apparatus 12 as illustrated in FIG. 26.

As described above, in the first modification, design elements having a relatively high percentage of the perceptual score are used as the fixed design elements, whereas design elements having a relatively low percentage of the perceptual score are used as non-fixed design elements. Design variations (similar samples) are created by keeping the fixed design elements unchanged and by changing only the non-fixed design elements. The fixed design elements influence the impression more than the non-fixed design elements. Accordingly, by changing the non-fixed design elements alone while keeping the fixed design elements unchanged, design variations that evoke the impression formed by the fixed design elements and in which an impression formed by the non-fixed design elements alone is changed are created. That is, by keeping the fixed design elements that greatly influences the impression unchanged and by changing only the non-fixed design elements that influences the impression little, multiple design variations that evoke a common impression formed by the fixed design elements and in which an impression formed by the non-fixed design elements differs are created. Since the influence of the non-fixed design elements on the impression is small, a difference between the impressions of the multiple design variations is small. In addition, a differences between the impression of the design sample (non-similar sample) selected by the user and the impressions of the multiple design variations are also small. Accordingly, the multiple design variations created by the similar design creation unit 84 correspond to samples having a design similar to the design sample (non-similar sample) selected by the user.

In accordance with the first modification, the design samples are displayed on the terminal apparatus 12 through two-step processes. Specifically, multiple non-similar samples that mainly evoke the same impression of the base style but that look differently from one another are created and displayed on the terminal apparatus 12 through the first process. For example, the user finds a tendency or trend of a design which the user is fond of by referring to the multiple non-similar samples and selects a non-similar sample having that tendency or trend from among the multiple non-similar samples. Then, similar samples similar to the design sample (non-similar sample) selected by the user are created and displayed on the terminal apparatus 12 through the second process. In this way, samples relatively similar to the non-similar sample are displayed on the terminal apparatus 12. The user then selects an intended design sample from among the similar samples. As described above, an intended design sample is selected by the user through the two-step narrow-down processes. Specifically, non-similar samples that mainly evoke the impression of the base style but that look differently from one another are displayed in the first step, and similar samples similar to a non-similar sample selected from among the non-similar samples are displayed in the second step. With such a configuration, it is more likely that design samples that match the purpose of the user are created or retrieved and an intended design sample is found, compared with the case where multiple design samples having the style similar to the style specified by the user are provided, for example. For example, in response to the user specifying a style (e.g., "pretty") that matches their preference, non-similar samples that mainly evoke an impression ("pretty") that matches the user's preference and that look differently from one another are provided during the process of the first step. Further, in response to the user specifying a non-similar sample that matches their preference from among the non-similar samples, multiple variations of similar samples similar to the non-similar sample are provided during the process of the second step. This consequently makes it easier for the user to select a sample suitable for their preference from among the multiple similar samples.

Note that a design sample other than the non-similar samples may be specified, and design samples (similar samples) similar to the specified design sample may be created.

Second Exemplary Embodiment

Figure 30:
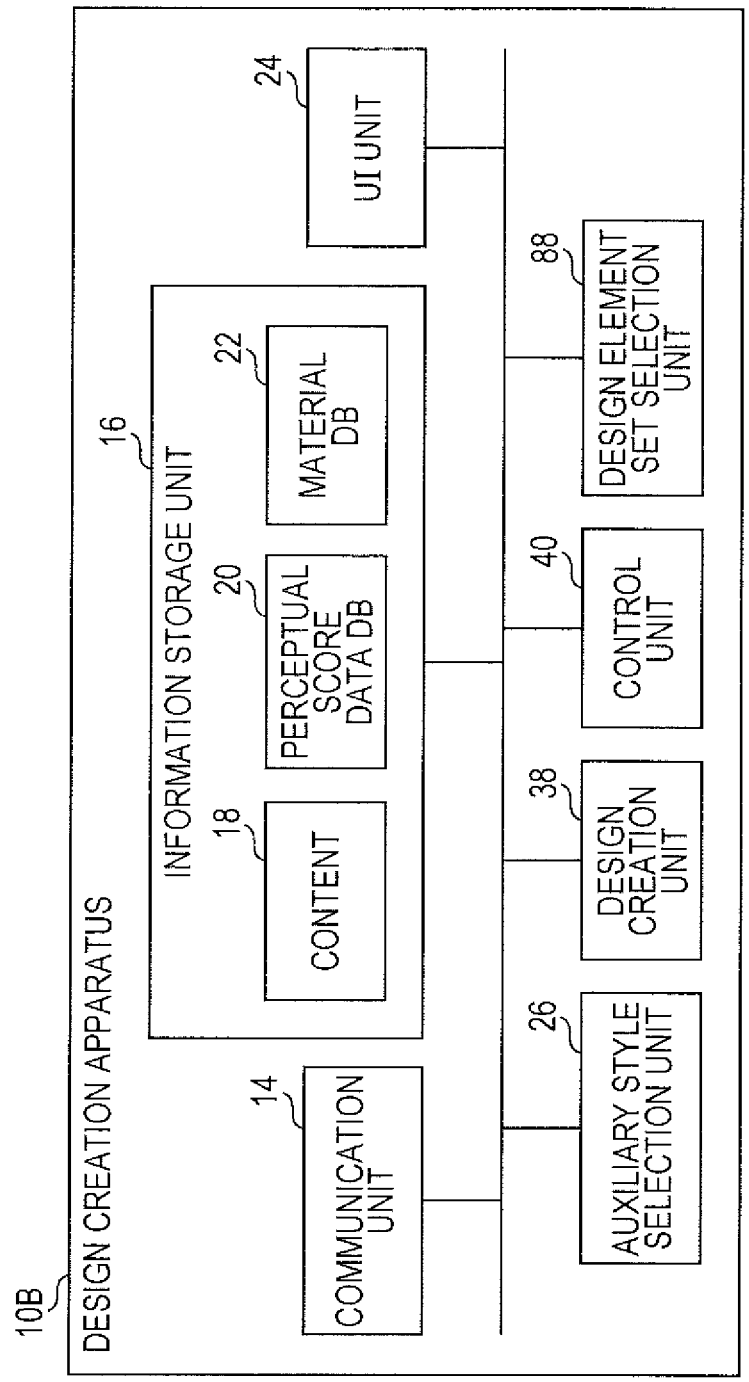
FIG. 30 is a block diagram illustrating a design creation apparatus according to a second exemplary embodiment.

A design creation apparatus 10B according to a second exemplary embodiment of the present invention will be described. FIG. 30 illustrates an example of the design creation apparatus 102 according to the second exemplary embodiment.

The design creation apparatus 10B according to the second exemplary embodiment includes a design element set selection unit 88 in place of the matching design element determination unit 28 according to the first exemplary embodiment. The configuration of the design creation apparatus 10B is the same as that of the design creation apparatus 10 according to the first exemplary embodiment except for the design element set selection unit 88.

The design element set selection unit 88 selects a design element set including design elements of the respective design items with reference to a score table created in advance, on the basis of a base style threshold set in advance and the auxiliary style selected by the auxiliary style selection unit 26. The design creation unit 38 creates a design sample by using the design element set selected by the design element set selection unit 88.

For each design item, one design element is selected from among multiple design elements that belong to the design item, and a set of the design elements thus selected for the respective design items corresponds to the design element set. For each design item, one design element is selected while changing the selected design element. Sets of such design items thus selected for the respective design items are determined as design element sets in advance.

For each design element set, a style estimate value (score) of a design sample created using the multiple design elements included in the design element set is calculated in advance. The score table is a table that represents the style estimate values (scores) of the respective design element sets. The style estimate value is, for example, the sum of the perceptual scores of the multiple design elements. The score table is created in advance for each style, and data of the score tables is stored in advance on the information storage unit 16.

The design creation apparatus 10B according to the second exemplary embodiment will be described in detail below.

The score table will be described in detail first with reference to FIG. 31. FIG. 31 illustrates an example of the score table.

The score table illustrated in FIG. 31 is a score table for the style "pretty". In the score table, the ranking, the attribute set ID (element set ID), the score (style estimate value), and the design element set are associated with one another. The raking indicates the rank of the score. The attribute set ID (element set ID) is identification information for identifying the design element set. The score is a style estimate value and is, for example, the sum of the perceptual scores of the multiple design elements included in the design element set.

The design element set is a set of multiple design elements each selected from a corresponding one of the multiple design items. For example, one design element is selected from among multiple design elements that belong to the design item "BACKGROUND DESIGN", and one design element is selected from among multiple design elements that belong to the design item "NAME/COMPANY NAME ALIGNMENT". The same applies to the other design items. Specifically, the design set ranked at the first place includes design elements "DESIGN A", "CENTER", "FONT A", "HORIZONTAL", "17-24", "CENTER", and "SLIGHTLY ABOVE". The score is, for example, the sum of perceptual scores of the design elements for the style "pretty". Multiple design element sets are created by changing the design element of each design item.

Although the score table illustrated in FIG. 31 is a table for the style "pretty", score tables are also created for the other styles similarly in advance.

Figure 32:
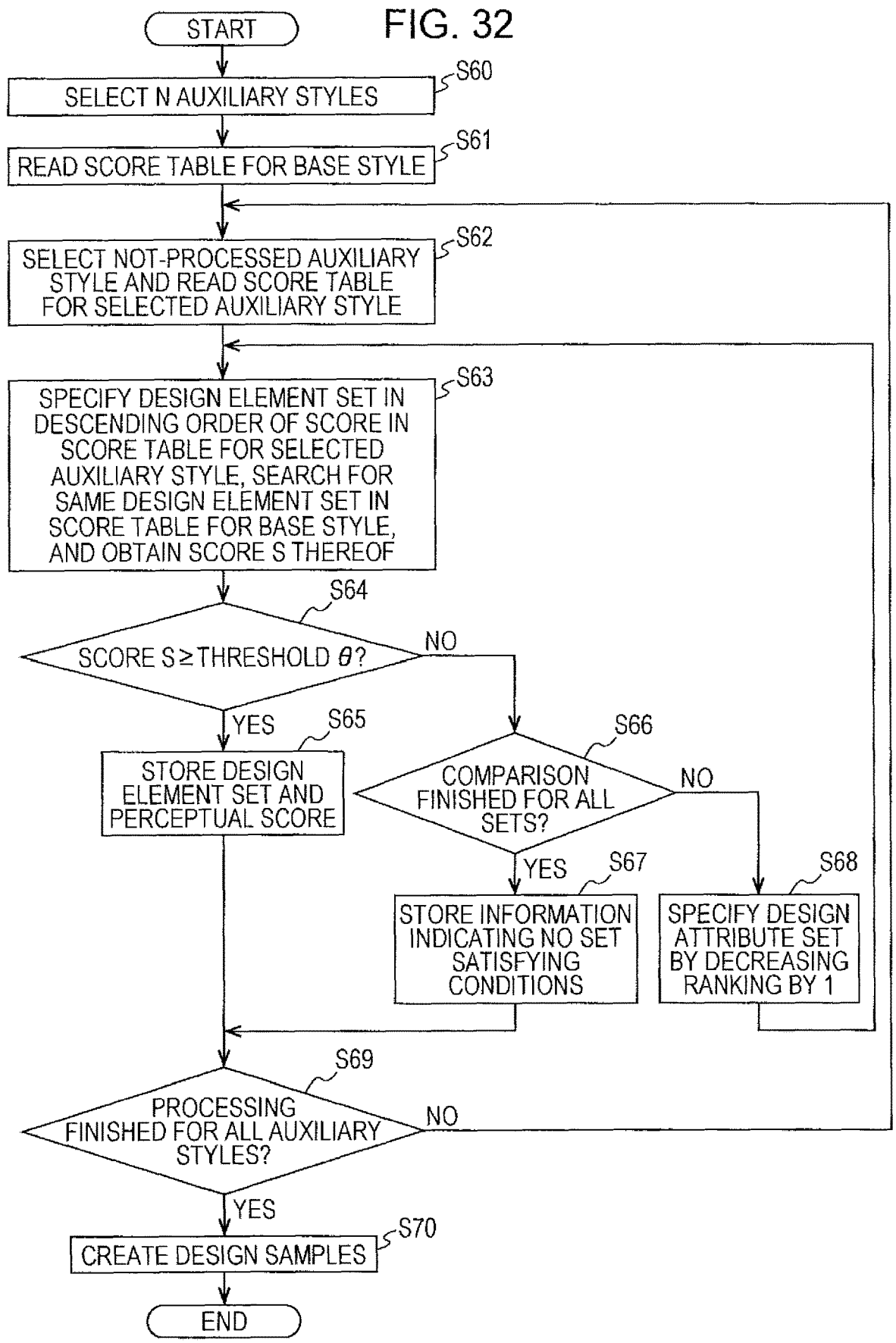
FIG. 32 is a flowchart illustrating a design element set selection process.

A process performed by the design element set selection unit 88 will be described in detail next with reference to FIG. 32. FIG. 32 is flowchart illustrating the process.

First, the user selects the base style by using the terminal apparatus 12 as in the first exemplary embodiment. In addition, the base style threshold θ is also set. The base style threshold θ may be set by the user or may be a value set in advance. For example, the user sets a given value for the base style threshold θ by using the UI unit 46 of the terminal apparatus 12. Note that the number of displayed samples and the like may be specified.

Then, N (N is an integer of 1 or greater) auxiliary styles are selected as in the first exemplary embodiment (S60).

In the design creation apparatus 10B, the design element set selection unit 88 reads the score table for the base style from the information storage unit 16 (S61).

In addition, the design element set selection unit 88 selects a not-processed auxiliary style from among the N auxiliary styles, and reads the score table for the auxiliary style from the information storage unit 16 (S62).

Then, the design element set selection unit 88 specifies a design element set in descending order of the score in the score table for the auxiliary style, searches for the same design element set in the score table for the base style, and obtains the score S of the retrieved design element set (score S for the base style) (S63).

If the score S is greater than or equal to the base style threshold θ (YES in S64), the design element set selection unit 88 selects the retrieved design element set as the matching design element set; and stores the matching design element set, the score S of the matching design element set for the base style, and the score of the matching design element set for the auxiliary style (S65).

If the score S is less than the base style threshold θ (NO in S64) and if processing of steps S63 and S64 has been finished for all the design element sets (YES in S66), the design element set selection unit 88 stores information indicating that there is no design element set that meets conditions (S67). If the processing of steps S63 and S64 has not been finished for all the design item sets (NO in S66), the design element set selection unit 88 specifies a design element set by decreasing the score rank by one (S68) and performs the processing of steps S63 and S64.

If the above processing has not been finished for the N auxiliary styles (NO in S69), the process returns to step S62, and the processing starting from step S62 is performed for another not-processed auxiliary style.

If the above processing has been finished for the N auxiliary styles (YES in S69), the design creation unit 38 creates design samples (non-similar samples) by using the matching design element sets selected by the design element set selection unit 88 (S70). In this way, N non-similar samples are created.

The process performed by the design element set selection unit 88 will be described below by using a specific example. FIG. 33 illustrates a score table 90 for the base style and a score table 92 for the auxiliary style.

The design element set selection unit 88 specifies a design element set in descending order of the score in the score table 92 for the auxiliary style, and selects the same design element set for which the score S for the base style becomes greater than or equal to the base style threshold θ for the first time as the matching design element set in the score table 90 for the base style. In the example illustrated in FIG. 33, a design element set 94 is selected as the matching design element set.

Since the design element set having the score that is greater than or equal to the base style threshold θ is used as the matching design element set, a design sample that mainly evokes the impression of the base style is created by using the matching design element set. In addition, since a design element set is specified in descending order of the score in the score table 92 for the auxiliary style and the matching design element set is searched for, a design sample having the maximum influence (level) of the auxiliary style is created. In this way, a design sample (non-similar sample) that mainly evokes the impression of the base style and additionally evokes the impression of the auxiliary style more strongly is created.

Data of the non-similar samples is transmitted from the design creation apparatus 10B to the terminal apparatus 12 via the communication channel N and the non-similar samples are displayed on the UI unit 46 of the terminal apparatus 12, as in the first exemplary embodiment described above. In addition, information representing the score of the matching design element set for the base style and information representing the score of the matching design element set for the auxiliary style may be transmitted to the terminal apparatus 12 together with the data of the non-similar samples.

Figure 34:
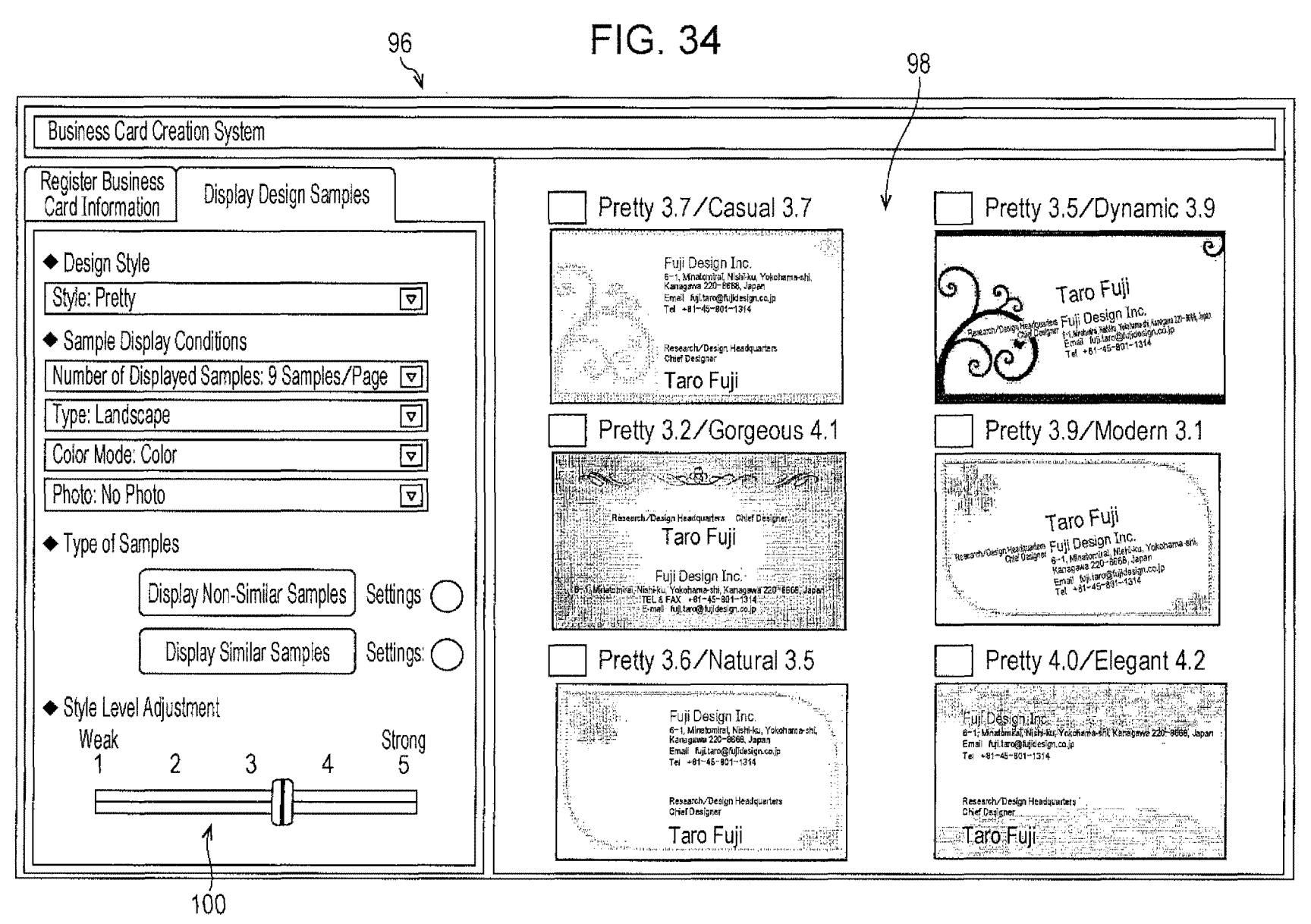

FIG. 34 illustrates an example of a design sample display screen 96 displayed on the terminal apparatus 12. The design sample display screen 96 shows a list 98 of design samples (non-similar samples). For example, the score of the matching design element set for the base style (e.g., Pretty 3.7) and the score of the matching design element set for the auxiliary style (e.g., Casual 3.7) are displayed together with each design sample. Needless to say, the scores need not be displayed.

The design sample display screen 96 also shows an icon for a slider 100 for adjusting the base style threshold θ (style level). In response to the user operating the slider 100, the base style threshold θ is changed in a range from 1 to 5, for example. When the base style threshold θ is set to "1", design samples having the weakest impression of the base style are created as the non-similar samples. When the base style threshold θ is set to "5", design samples having the strongest impression of the base style are created as the non-similar samples. The base style threshold θ is dynamically changed by using the slider 100, and non-similar samples displayed in the design sample display screen 96 changes in response to that change.

Design samples may be created in advance by using design element sets and data of the design samples may be stored in advance on the information storage unit 16 in the second exemplary embodiment, as in the first exemplary embodiment. In this case, the design creation unit 38 obtains a design sample including the matching design element set as the non-similar sample from the information storage unit 16.

Second Modification

Figure 35:
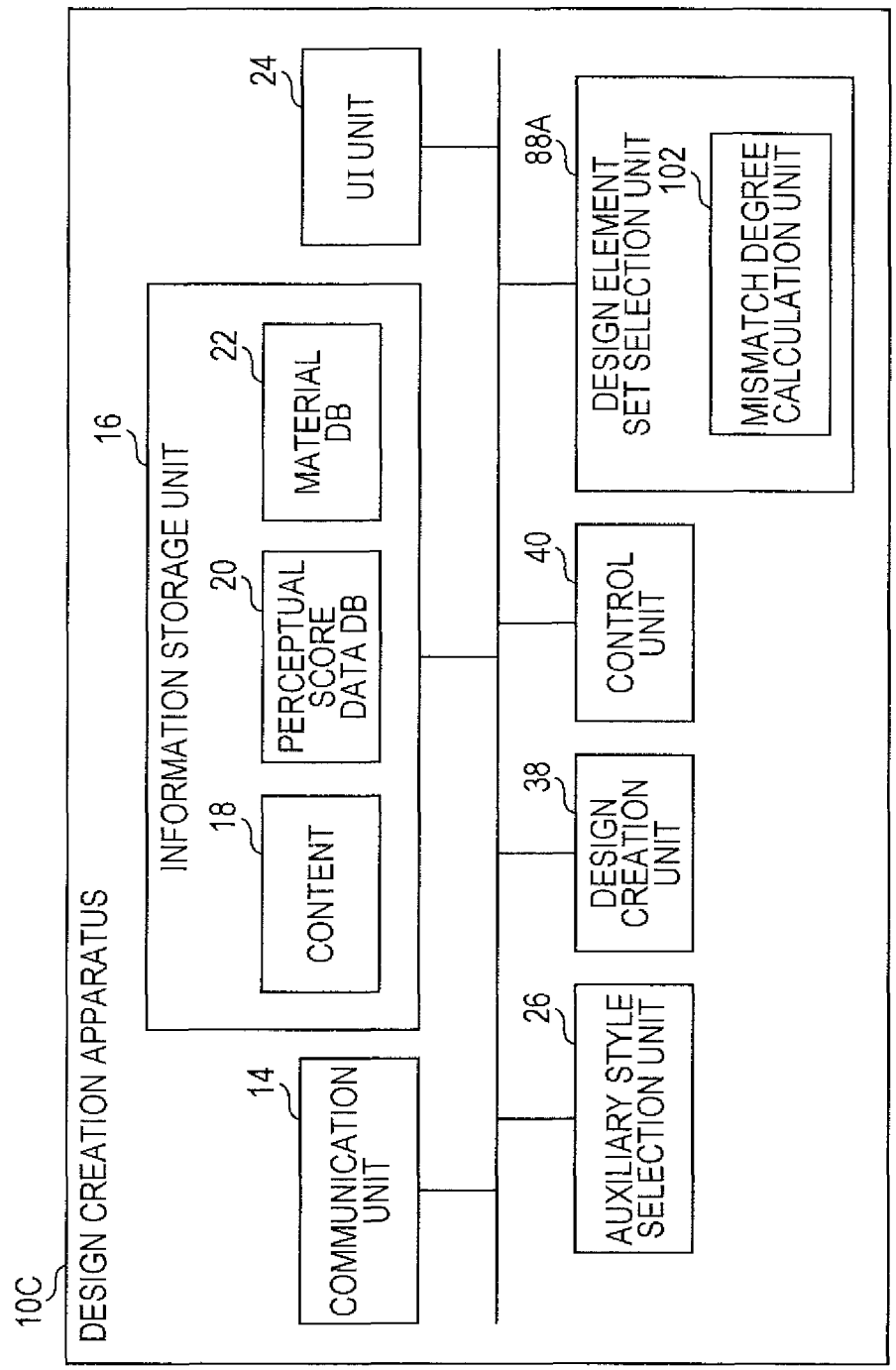
FIG. 35 is a block diagram illustrating a design creation apparatus according to a second modification.

A design creation apparatus 100 according to a second modification will be described below with reference to FIG. 35. FIG. 35 illustrates an example of the design creation apparatus 100 according to the second modification.

The design creation apparatus 100 according to the second modification includes a design element set selection unit 88A in place of the design element set selection unit 88 according to the second exemplary embodiment. The configuration of the design creation apparatus 100 is the same as that of the design creation apparatus 10B according to the second exemplary embodiment except for the design element set selection unit 88A.

The design element set selection unit 88A has the same function as that of the design element set selection unit 88 according to the second exemplary embodiment and further includes a mismatch degree calculation unit 102.

The mismatch degree calculation unit 102 calculates a difference degree (mismatch degree) between design element sets among all design element sets having the score that is greater than or equal to the base style threshold θ and selects N (N is an integer of 1 or greater) design element sets including different design elements. For example, the mismatch degree calculation unit 102 calculates the number of different design elements (the number of not-overlapping elements) in the design element sets and selects a design element set for which the number is greater than or equal to a threshold. The threshold may be a value set in advance or may be changed by the user.

The design creation unit 38 creates a design sample (non-similar sample) by using the design element set selected by the mismatch degree calculation unit 102.

In accordance with the second modification, design samples (non-similar samples) are created by using design element sets including design elements different from each other. With this configuration, resembling non-similar samples are less likely to be created.

In the case where multiple design element sets having the same non-overlapping number are selected, the difference degree may be made different by applying different weights for individual design elements.

The design creation apparatuses 10, 10A, 10B, and 10C described above are implemented as a result of cooperation of hardware resources and software, for example. Specifically, the design creation apparatuses 10, 10A, 10B, and 10C each include a processor (not illustrated), such as a central processing unit (CPU). The processor reads a program stored on a storage device (not illustrated) and executes the program, whereby functions of the individual units of the design creation apparatuses 10, 10A, 10B, and 10C are implemented. The program may be stored on the storage device via a recording medium, such as a Compact Disc (CD) or a Digital Versatile Disc (DVD), or a communication channel, such as a network. Alternatively, the individual units of the design creation apparatuses 10, 10A, 10B, and 10C may be implemented by hardware resources, for example, a processor or an electronic circuit. A device such as a memory may be used to implement the individual units of the design creation apparatuses 10, 10A, 10B, and 10C. Alternatively, the individual units of the design creation apparatuses 10, 10A, 10B, and 10C may be implemented by a digital signal processor (DSP) or a field programmable gate array (FPGA).

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An information processing apparatus comprising: a processor programmed to: determine a combination of matching design elements that meets a base impression evocation criterion, by combining (i) a plurality of design elements which correspond to a base style having a base impression and (ii) a plurality of design elements which correspond to an auxiliary style having an auxiliary impression different from the base impression of the base style; and create a design sample by using the combination of the matching design elements, the design sample being constituted by a plurality of design items, and each of the plurality of design items being associated with a plurality of design elements that define a design of the design item; compute, for each of the plurality of design elements, a mixed perceptual score of the design element by mixing a base perceptual score that represents a degree of the design element contributing to evocation of the base impression of the base style and an auxiliary perceptual score that represents a degree of the design element contributing to evocation of the auxiliary impression of the auxiliary style; and determine, for each of the plurality of design items, a largest-value design element having the largest mixed perceptual score among the plurality of design elements; compute a base impression evocation degree on the basis of a sum of the base perceptual scores of the largest-value design elements of all the design items; determine, as the combination of the matching design elements, a combination of the largest-value design elements for which the base impression evocation degree is greater than or equal to an evocation degree threshold, and perform control to display, on a display device, the design sample, information for identifying the base style, and information for identifying the auxiliary style used in the combination of the matching design elements.

2. The information processing apparatus according to claim 1, wherein the processor is programmed to:
   compute, for each mixing ratio and for each of the plurality of design elements, the mixed perceptual score of the design element at the mixing ratio by mixing the base perceptual score and the auxiliary perceptual score of the design element at the mixing ratio while changing the mixing ratio, and determine the largest-value design element for each of the plurality of design items at each mixing ratio;
   compute, for each mixing ratio, the base impression evocation degree on the basis of a sum of the base perceptual scores of the largest-value design elements of all the design items; and
   determine, as the combination of the matching design elements, a combination of the largest-value design elements for which the base impression evocation degree is greater than or equal to the evocation degree threshold at each mixing ratio.

3. The information processing apparatus according to claim 2, wherein the processor is programmed to:
   compute, for each mixing ratio and for each of the plurality of design elements, the mixed perceptual score of the design element at the mixing ratio by mixing the base perceptual score and the auxiliary perceptual score of the design element at the mixing ratio while increasing a percentage of the auxiliary style in the mixing ratio step by step, and determine the largest-value design element for each of the plurality of design items at each mixing ratio;
   compute, for each mixing ratio, the base impression evocation degree on the basis of the sum of the base perceptual scores of the largest-value design elements of all the design items; and
   determine, as the combination of the matching design elements, a combination of the largest-value design elements identified through a computation performed using a mixing ratio in which the percentage of the auxiliary style is lower by one step than a percentage in a mixing ratio for which the base impression evocation degree becomes less than the evocation degree threshold.

4. The information processing apparatus according to claim 1, wherein the processor is programmed to:

determine the combination of the matching design elements by computing the base impression evocation degree while changing the auxiliary style.

* * * * *